United States Patent [19]
Sato et al.

[11] Patent Number: 6,054,254
[45] Date of Patent: Apr. 25, 2000

[54] COMPOSITION FOR UNDERLYING FILM AND METHOD OF FORMING A PATTERN USING THE FILM

[75] Inventors: Yasuhiko Sato; Yasunobu Onishi, both of Yokohama, Japan

[73] Assignee: Kabushiki Kaisha Toshiba, Kawasaki, Japan

[21] Appl. No.: 09/108,967

[22] Filed: Jul. 2, 1998

[30] Foreign Application Priority Data

Jul. 3, 1997 [JP] Japan ................................ 9-178671

[51] Int. Cl.$^7$ ................ G03C 5/56; G03C 1/76
[52] U.S. Cl. ............. 430/322; 430/325; 430/328; 430/270.1
[58] Field of Search .................. 430/512, 322, 430/325, 328, 281.1, 270.1, 296, 294, 156, 394

[56] References Cited

U.S. PATENT DOCUMENTS

| | | | |
|---|---|---|---|
| 4,863,827 | 9/1989 | Jain et al. ........................ | 430/145 |
| 5,580,702 | 12/1996 | Hayase et al. .................... | 430/326 |
| 5,731,126 | 3/1998 | Takemura et al. ................ | 430/270.1 |
| 5,783,361 | 7/1998 | Conley et al. .................... | 430/271.1 |
| 5,795,701 | 8/1998 | Conley et al. .................... | 430/325 |
| 5,851,738 | 12/1998 | Thackeray et al. ............... | 430/327 |

OTHER PUBLICATIONS

J. Sturtevant et al., "Removable Organic Antireflection Coating", SPIE, vol. 2724, pp. 738–746 (1996).

*Primary Examiner*—Janet Baxter
*Assistant Examiner*—Yvette M Clarke
*Attorney, Agent, or Firm*—Finnegan, Henderson, Farabow, Garrett & Dunner, L.L.P.

[57] ABSTRACT

A method of forming a pattern which comprises the steps of forming an underlying film on a work film, forming a resist film on the underlying film, exposing the underlying film and the resist film to a patterning exposure light, and developing predetermined regions thus exposed of the resist film and the underlying film with a developing solution. The underlying film has a property that the solubility thereof to the developing solution can be changed by an action of an acid. The resist film and/or the underlying film contains a compound which is capable of generating the acid.

10 Claims, 6 Drawing Sheets

COMPOSITION FOR UNDERLYING FILM AND METHOD OF FORMING A PATTERN USING THE FILM

BACKGROUND OF THE INVENTION

This invention relates to a material for manufacturing a semiconductor device and to a method of manufacturing a semiconductor device. In particular, this invention relates to a composition for an underlying film to be employed for forming a pattern on the surface of wafer, and to a method of forming a pattern by making use of this composition.

The manufacturing method of a semiconductor element generally involves the steps of depositing a plurality of layers comprising a plurality of materials on a semiconductor wafer, and patterning these deposited layers into a desired pattern. This patterning step is generally performed as follows. Namely, at first, a work film (a film to be worked or processed) such as a thin film of an insulating material, a conductive material or a semiconductive material is deposited on the surface of wafer, and then a resist material is coated on this work film by means of a spin-coating method for instance thereby to form a resist film. Thereafter, the resist film is selectively exposed and then subjected to a developing process to form a resist pattern.

Subsequently, the work film such as a thin film of an insulating material, a conductive material or a semiconductive material which has been formed in advance on the substrate is etched using the resist pattern as an etching mask, thereby forming a desired pattern such as a fine pattern of wiring or opening.

It is important in this patterning process to control the dimension of the resist pattern in high precision. However, if the reflectance of a substrate to an irradiated light is high, a standing wave of an exposure light is generated in the resist film, so that the dimension of resist pattern would be affected by any slight degree of non-uniformity in thickness of the resist film. Due to this reason, it is difficult to obtain a resist pattern of high precision.

In order to overcome this problem, there has been proposed a method wherein an underlying film such as an anti-reflective film which is capable of inhibiting the reflection of exposure light from the work film is formed on a work film so as to minimize the intensity of light to be reflected from the work film to the resist film (Japanese Patent Unexamined Publication S/58-91635). When an anti-reflective film is interposed between a resist film and a work film, the exposure light passing through the resist film is multi-reflected in the anti-reflective film and hence attenuated ultimately, or otherwise, the exposure light passing through the resist film is absorbed by the anti-reflective film, and hence the reflection of the exposure light from the interface below the resist film is inhibited. As a result, the standing wave to be generated in the resist film is weakened, thus making it possible to enhance the dimension controllability of the resist pattern.

As for this anti-reflective film, a resin film which is disclosed in Japanese Patent Unexamined Publication S/59-149045 has been widely employed, since the resin film can be formed into a film by means of spin coating, which is low in process cost. In the employment of this resin film as an anti-reflective film, the following materials and working methods have been employed.

(1) A method wherein a plasma-decomposition type resin is employed for forming an anti-reflective film, which is then etched using a resist pattern as an etching mask.

(2) A method wherein a resin which is soluble in an alkaline developing solution is employed for forming an anti-reflective film, which is then subjected to a patterning exposure thereby to form a latent image of pattern in the resist film as well as in the anti-reflective film, these latent image portions being concurrently etched away in a subsequent developing treatment.

(3) A method wherein a photosensitive composition which is capable of absorbing an exposure light is employed for forming an anti-reflective film, which is then subjected to a patterning exposure thereby to form a latent image of pattern in the anti-reflective film, this latent image portion being etched away in a subsequent developing treatment.

(4) A method wherein a photosensitive resin such as polymethyl methacrylate or polysulfone is employed for forming an anti-reflective film, which is then developed using a PCM method (Portable Comformable Masking).

However, the aforementioned conventional methods are all accompanied with some sort of problem. For example, in the case of the method (1), although it is possible to obtain an anti-reflective film having a perpendicular wall as shown in FIG. 1A, it is difficult to assure a sufficient etching selectivity, since a resin film 42 constituting an anti-reflective film is formed of the same kind of organic material as that of a resist film 43. As a result, the resist film 43 may be concurrently etched away at the occasion of etching the anti-reflective film 42 to the same extent as that or a higher extent than that of the anti-reflective film 42. As a result, it is no more possible to secure a sufficient film thickness of the resist film which is required for the etching of a work film. This problem becomes more prominent in the case where the film thickness of resist film is desired to be thinned for the purpose of enhancing the resolution in view of an increasingly severe limitation in optical lithography.

In the case of the method (2), a predetermined region of the anti-reflective film is not removed in a dry etching, so that the reduction in film thickness of the resist film can be suppressed. However, since the developing proceeds isotropically at the occasion of removing the anti-reflective film 42 with a developing solution, the shape of pattern to be obtained after a developing treatment becomes such as shown in FIG. 1B, i.e. a pattern having undercut (concaved) sides. Therefore, it is difficult to obtain an anti-reflective film pattern having a desired width.

In the case of the method (3), since the exposure light is absorbed by the anti-reflective film, a photo-reaction would not take place sufficiently at the bottom portion of the anti-reflective film 42. As a result, a residual layer 44 may be left remained as shown in FIG. 1C after the developing treatment. Further, in the case of the method (4), if a conventional material is employed, it is difficult to attain a sufficient resolution, so that it is difficult to obtain a pattern having a line width of less than subquarter micron, and at the same time, a residual layer 44 may be left remained as shown in FIG. 1C.

BRIEF SUMMARY OF THE INVENTION

Therefore, an object of the present invention is to provide a composition for an underlying film which is capable of forming a pattern having a perpendicular side wall and being excellent in cross-sectional configuration, i.e. a rectangular cross-section.

Another object of the present invention is to provide a method of forming an underlying film pattern having a perpendicular side wall and being excellent in cross-sectional configuration, i.e. a rectangular cross-section, the method being capable of inhibiting the film-thinning of a resist pattern superimposed on the underlying film and enabling to obtain an underlying film pattern with high resolution and high dimension precision.

Namely, this invention provides a composition for an underlying film which comprises;

a compound having a substituent group which is adapted to be decomposed by an acid and capable of generating an alkali-soluble group after the decomposition thereof; and a photo-acid-generating agent which is capable of generating the acid.

Further, this invention provides a composition for an underlying film which comprises;

a compound having a substituent group which is adapted to be cross-linked by an acid; and a photo-acid-generating agent which is capable of generating the acid.

Further, this invention provides a composition for an underlying film which comprises;

a compound having a substituent group which is adapted to be decomposed by an acid and capable of generating an alkali-soluble group after the decomposition thereof; and a photo-acid-generating agent which is capable of generating the acid;

wherein the composition further comprises a polycyclic aromatic hydrocarbon group.

Further, this invention provides a method of forming a pattern which comprises the steps of;

forming an underlying film on a work film;

forming a resist film on the underlying film;

exposing the underlying film and the resist film to a patterning exposure light; and developing predetermined regions thus exposed of the resist film and the underlying film with a developing solution;

wherein the underlying film has a property that the solubility thereof to the developing solution can be changed by an action of an acid; and the resist film and/or the underlying film contains a compound which is capable of generating the acid.

Further, this invention provides a method of forming a pattern which comprises the steps of;

forming an underlying film on a work film;

forming a resist film containing a phenolic resin on the underlying film;

exposing the resist film to a patterning exposure light using a first irradiation of light;

developing the resist film thus exposed with a developing solution to form a resist pattern;

exposing the underlying film through the resist pattern used as a mask to a patterning exposure light using a second irradiation of light; and developing an exposed region of the underlying film;

wherein the underlying film is constituted by an underlying film composition containing a compound having a substituent group which is adapted to be decomposed by an acid and capable of generating an alkali-soluble group after the decomposition thereof, and a photo-acid-generating agent which is capable of generating the acid; the underlying film composition further comprising a polycyclic aromatic hydrocarbon group.

Further, this invention also provides a method of forming a pattern which comprises the steps of;

forming an underlying film on a work film, the underlying film containing a compound having a substituent group which is adapted to be decomposed by an acid and capable of generating an alkali-soluble group after the decomposition thereof, and a photo-acid-generating agent which is capable of generating the acid;

forming a resist film containing a phenolic resin on the underlying film;

exposing the resist film to an electric charge beam;

developing the resist film thus exposed to form a resist pattern;

exposing the underlying film through the resist pattern used as a mask to an irradiation of light; and developing an exposed region of the underlying film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figures 1A, 1B, 1C, 2A, 2B, 2C, 2D:
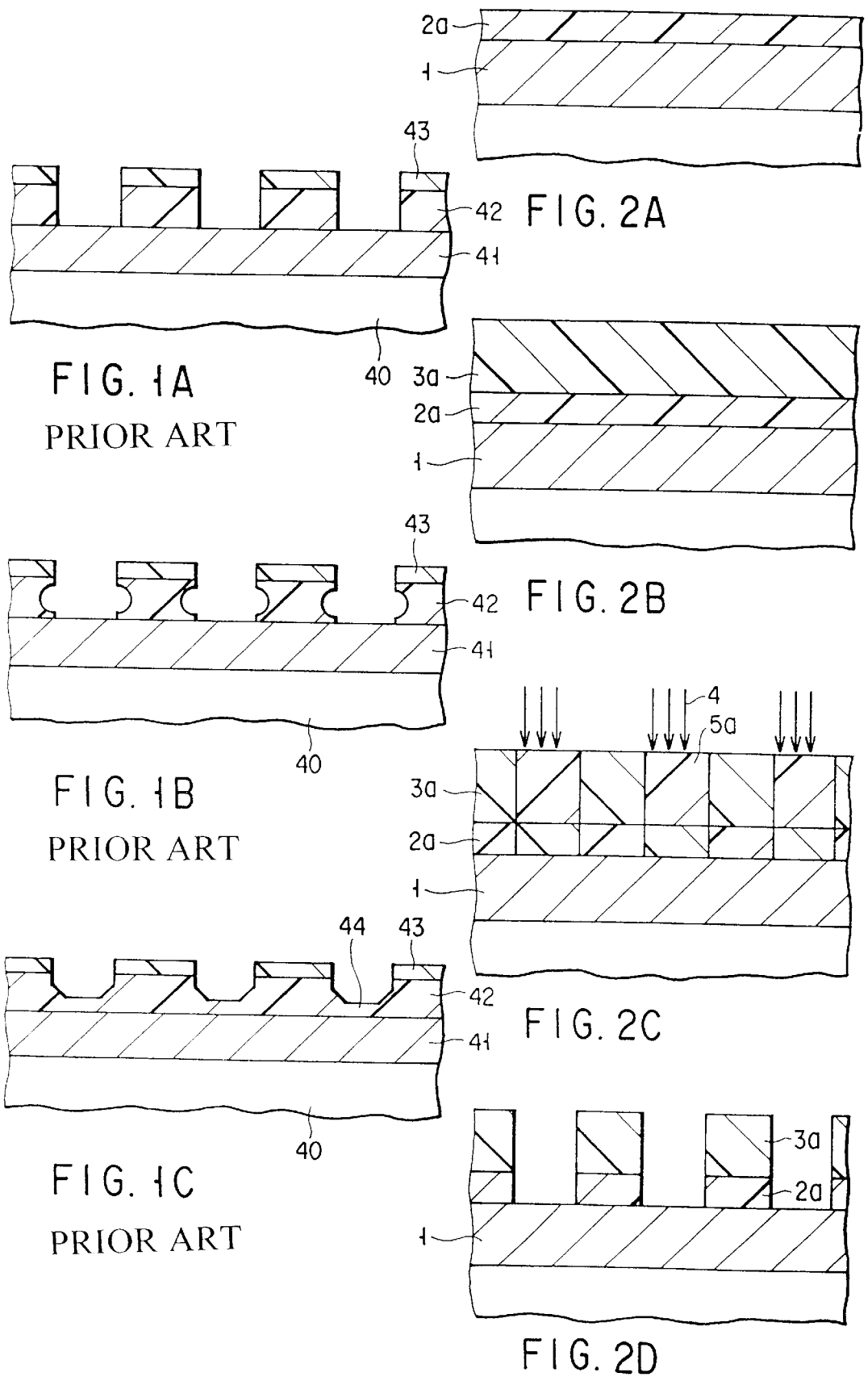
FIGS. 1A to 1C illustrate cross-sectional views of patterns to be obtained by the pattern-forming methods according to the prior art.
FIGS. 2A to 2D illustrate cross-sectional views sequentially showing the steps of forming a pattern, representing one example according to this invention.

This invention will be further explained in details as follows.

The underlying film composition according to a first Group of this invention is constituted by a composition containing a compound having a substituent group which is adapted to be decomposed by an acid, and a photo-acid-generating agent which is capable of generating the aforementioned acid. An underlying film to be formed by making use of the underlying film composition according to this invention can be employed as an underlying film for a resist layer, such as an anti-reflective film. In this case, a positive resist can be generally employed as this resist layer.

The underlying film composition according to a first Group of this invention contains a compound having a substituent group which is adapted to be decomposed by an acid and capable of generating an alkali-soluble group after the decomposition thereof. When this underlying film composition is employed to form an underlying film in the manufacture of a semiconductor device, a resist film is formed on the surface of this underlying film. When a positive resist is employed for this resist film, an acid is generated from the photo-acid-generating agent in the underlying film and diffused throughout the underlying film, thereby causing the aforementioned compound contained in the underlying film to decompose, thus allowing an alkali-soluble group to generate from the compound. As a result, the light exposure portion of the underlying film becomes highly soluble in an alkaline aqueous solution.

The compound to be employed in this invention and having a substituent group which is adapted to be decomposed by an acid and capable of generating an alkali-soluble group after the decomposition thereof is capable of functioning as a solubility inhibiting agent. As for this solubility inhibiting agent, a compound having the following properties can be employed. Namely, this compound keeps a solubility inhibiting function to an alkali-soluble resin as long as it is not exposed to light. Further, this compound is of a kind which has a substituent group which is adapted to be decomposed in the presence of an acid, and is capable of generating —O, —COO or —SO$_3$ when it is decomposed by an action of alkaline solution after the decomposition thereof. Examples of such a solubility inhibiting agent are those set forth in U.S. Pat. Nos. 4,491,628 and 4,603,101, or in Japanese Patent Unexamined Publication S/63-27829, or compounds having a carboxylic group or a phenolic hydroxide group attached to the skeleton thereof and part or all of the hydroxyl terminals are substituted by a protective group that can be decomposed by an acid. Specific examples of this protective group are t-butyl ester, t-butoxycarbonyl, tetrahydropyranyl, silyl and an alicyclic group. Specific examples of these compounds are set forth below.

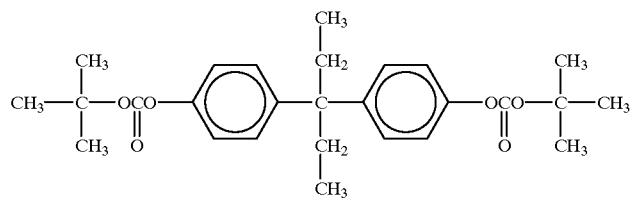

i-1

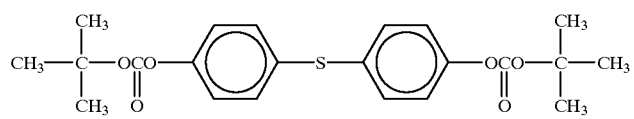

i-2

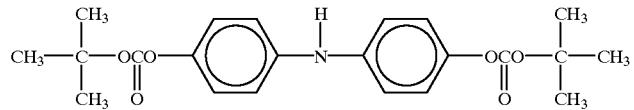

i-3

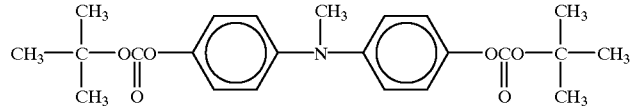

i-4

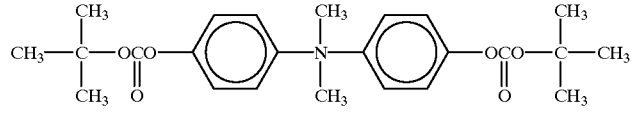

i-5

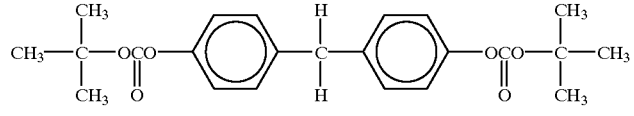

i-6

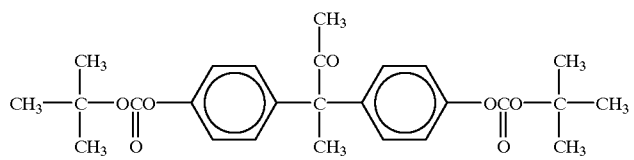
i-7
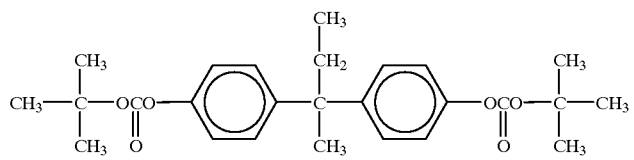
i-8
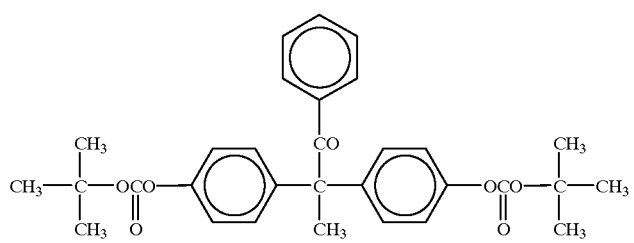
i-9
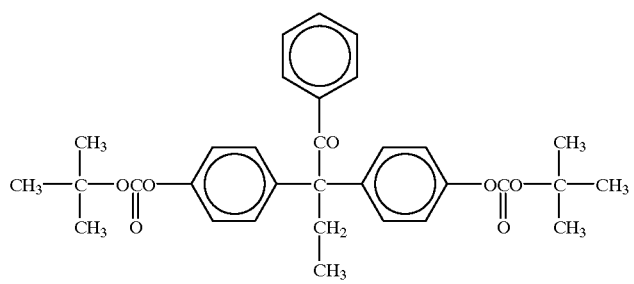
i-10
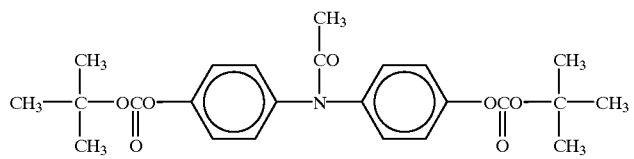
i-11
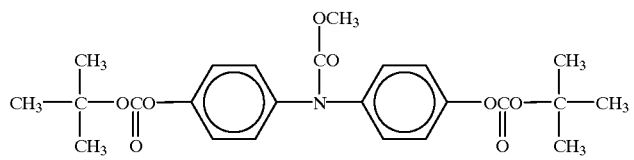
i-12
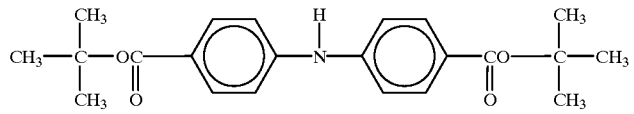
i-13
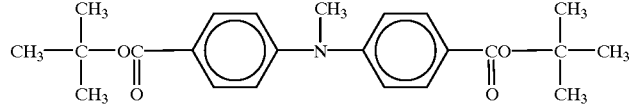
i-14

-continued
i-15
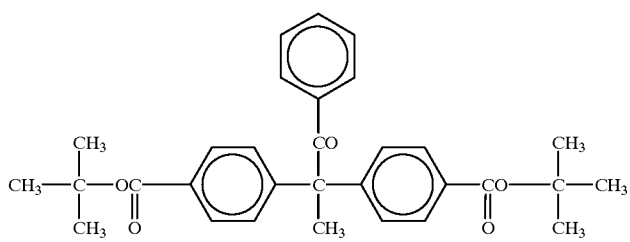
i-16
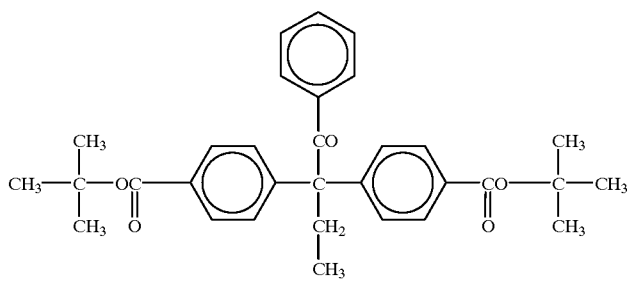
i-17
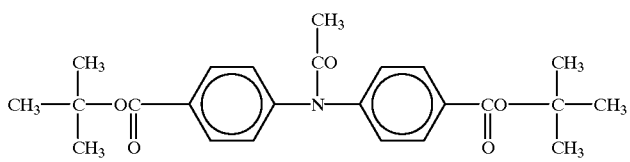
i-18
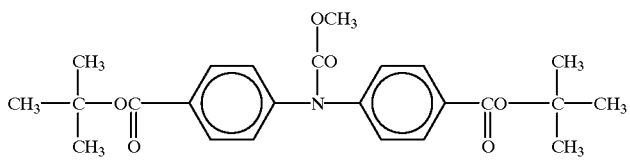
i-19
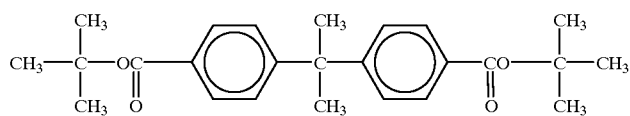
i-20
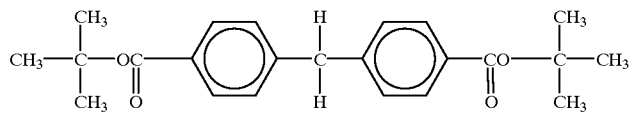
i-21
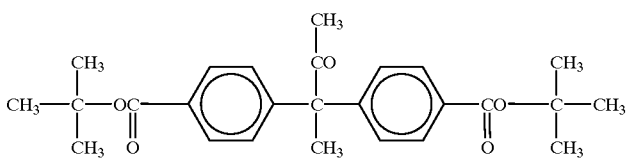
i-22
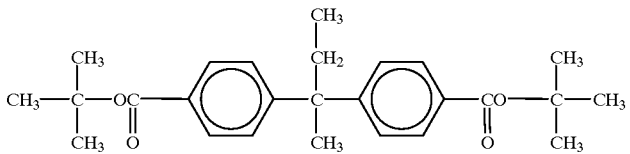

-continued
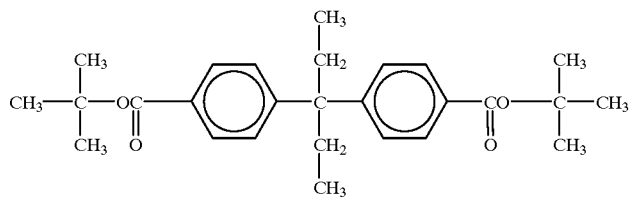
i-23
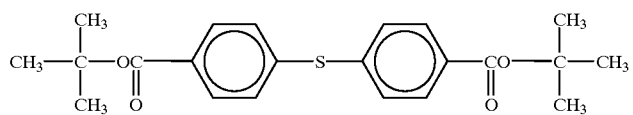
i-24
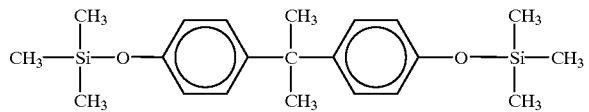
i-25
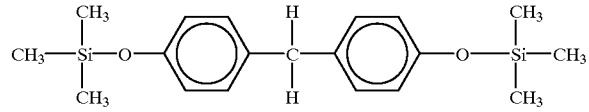
i-26
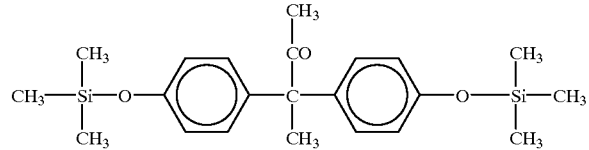
i-27
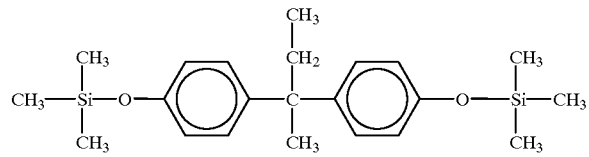
i-28
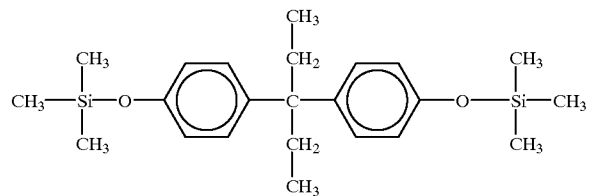
i-29
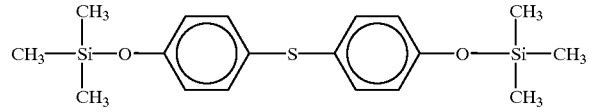
i-30
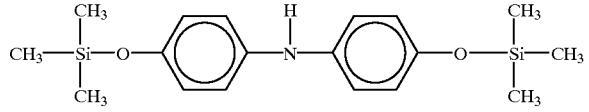
i-31
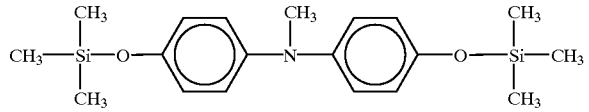
i-32

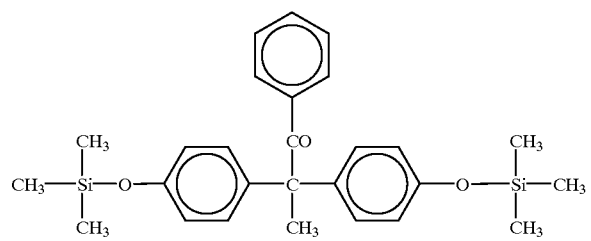
i-33
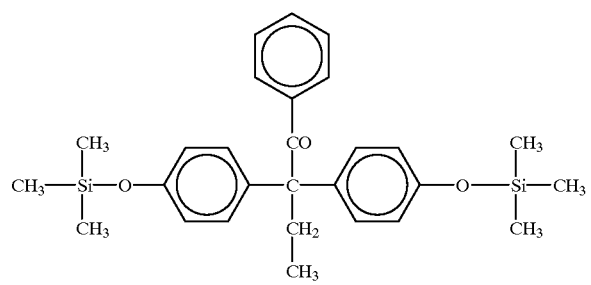
i-34
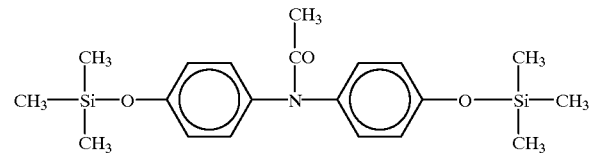
i-35
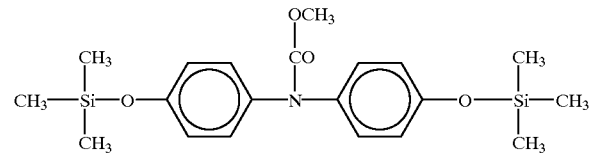
i-36
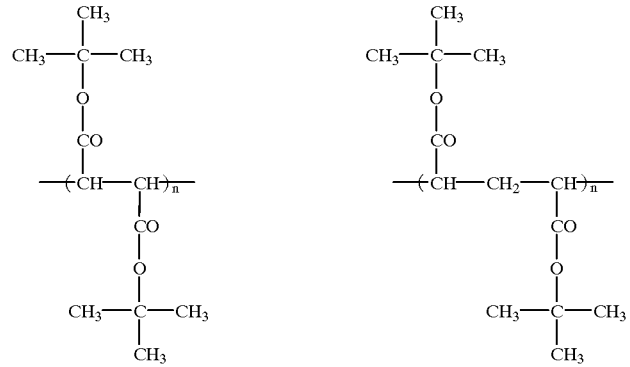
i-37
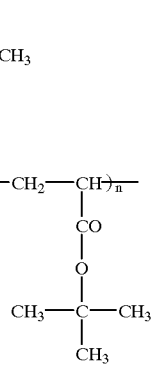
i-38

-continued
i-39 i-40 i-41 i-42 i-43
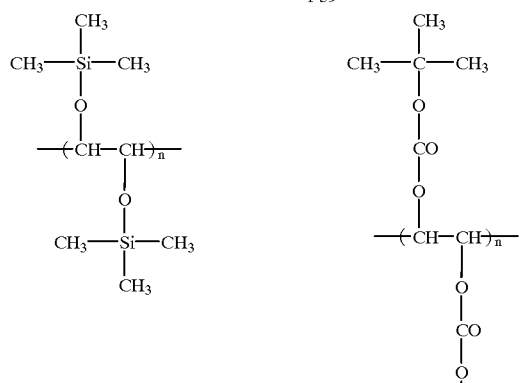
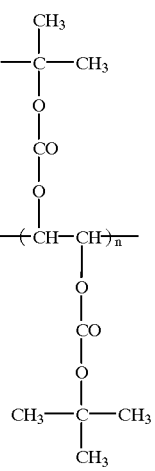
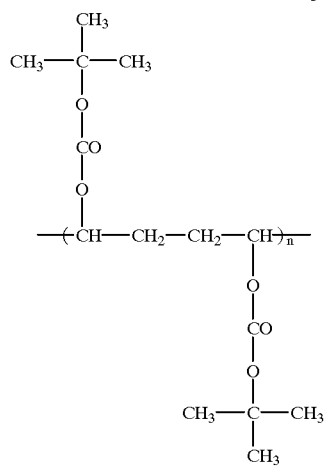
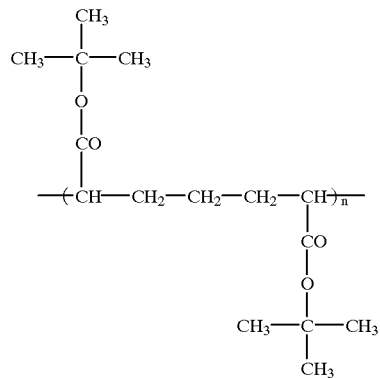
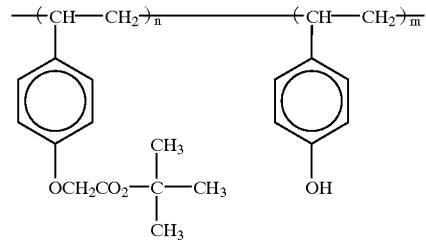

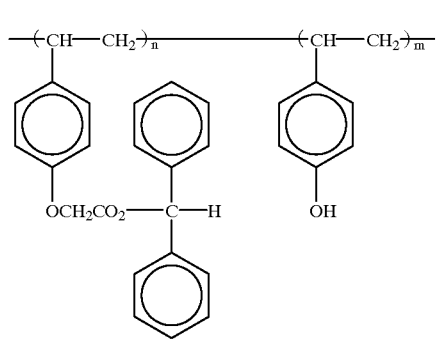
i-44
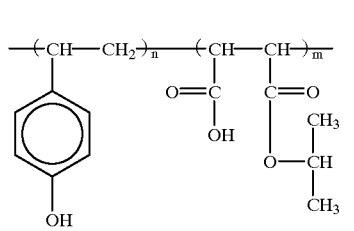
i-45
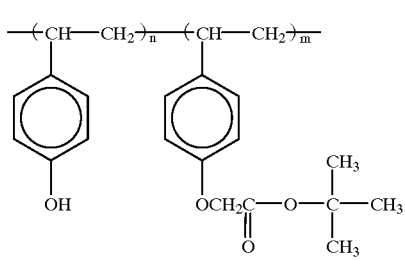
i-46
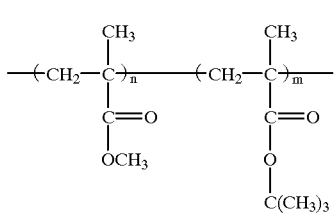
i-47
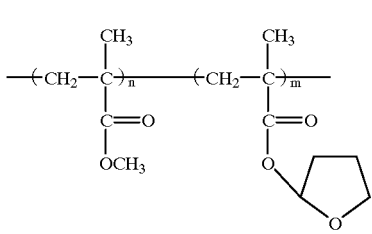
i-48
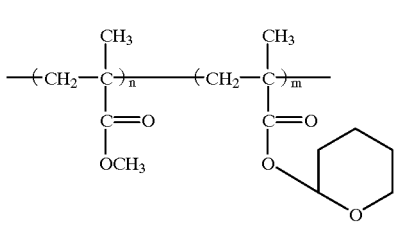
i-49

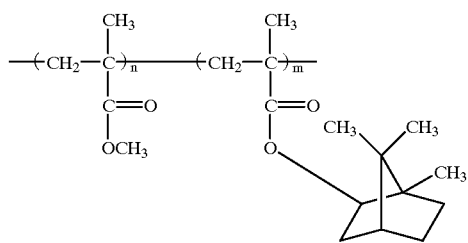

i-50

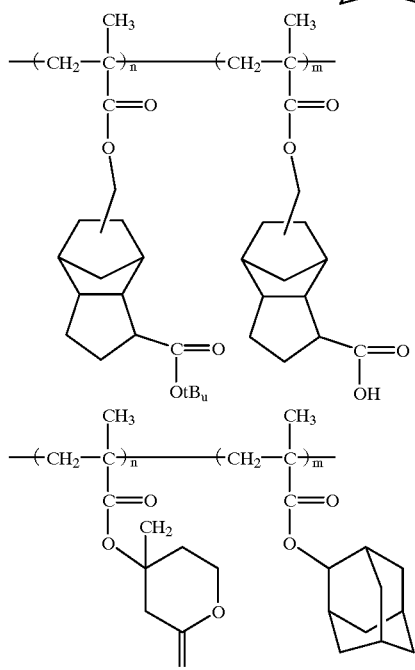

i-51 i-52

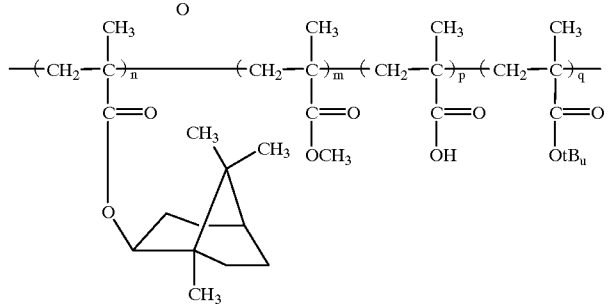

i-53 wherein m, n, p and q denote respectively a positive integer, representing respectively a polymerization degree or a component ratio of copolymers (polymerization ratio).

The mixing ratio of the solubility inhibiting agent in the composition of the first Group of this invention should preferably be in the range of 10 to 99.999 parts by weight per 100 parts by weight of solid matters in the underlying film composition. Because if the mixing ratio of the solubility inhibiting agent is less than 10 parts by weight, it may become difficult to secure a sufficient contrast between an exposure portion and a non-exposure portion, thus making it difficult to form a fine pattern of less than sub-quarter micron. On the other hand, if the mixing ratio of the solubility inhibiting agent exceeds over 99.999 parts by weight, the ratio of a photo-acid-generating agent to be included in the underlying film would become too low, so that it would be difficult to make the solubility inhibiting agent alkali-soluble.

It would be preferable in this invention to employ a solubility inhibiting agent having a side chain to which a polycyclic aromatic hydrocarbon group is attached, if the light exposure is to be performed using a light source having a wavelength of 240 to 450 nm. This polycyclic aromatic hydrocarbon group may be either substituted or unsubstituted bicyclic or polycyclic group. The reason for employing a solubility inhibiting agent having a polycyclic aromatic hydrocarbon group is that the polycyclic aromatic hydrocarbon group is superior in absorbency to the exposure light, thus enabling to inhibit the reflection of exposure light to a resist film. Followings are specific examples of such a solubility inhibiting agent.

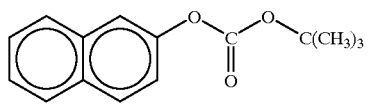
i-54

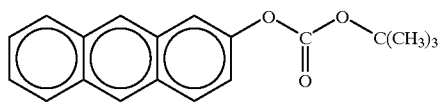
i-55

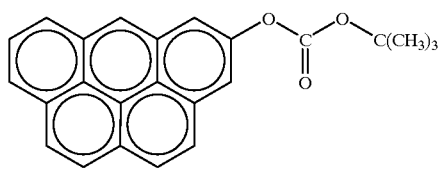
i-56

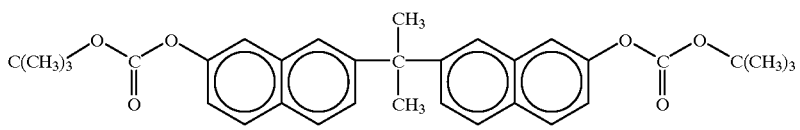
i-57

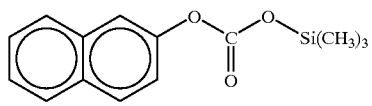
i-58

Further, a compound having a structure represented by the following general formula (1) is most preferable as this solubility inhibiting agent.

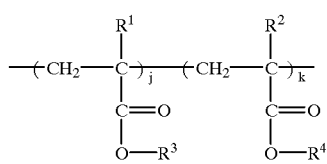
(1)

wherein $R^1$ and $R^2$ may be the same or different and are individually hydrogen atom or methyl group; $R^3$ is a protective group which can be decomposed by an acid thereby to be turned into an alkali-soluble group; $R^4$ is a substituted or unsubstituted polycyclic aromatic hydrocarbon group; and j and k are respectively a positive integer.

As for the $R^3$ in the aforementioned general formula (1), t-butyl ester, t-butoxycarbonyl, tetrahydropyranyl, silyl or an alicyclic group can be exemplified. Followings are examples of such a group.

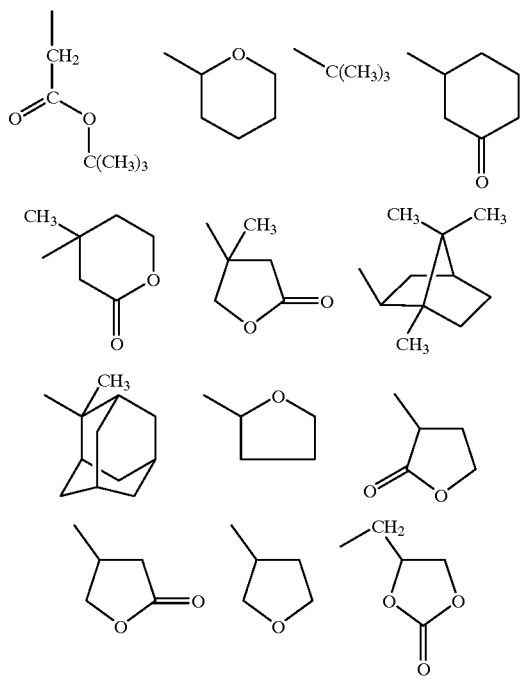

If the ratio of the protective group $R^3$ in the aforementioned general formula (1) (j/(j+k)) is defined as X, the range of X should preferably be 0.05<X<0.95. If the value of X is 0.05 or less, the solubility of the compound to an alkaline developing solution may become excessively high. On the other hand, if the value of X exceeds over 0.95, it may become difficult to dissolve the compound in an alkaline developing solution, resulting in a deterioration in resolution of the underlying film in the case where a fine resist pattern is desired to be produced.

Followings are specific examples of the compound represented by the aforementioned general formula (1).

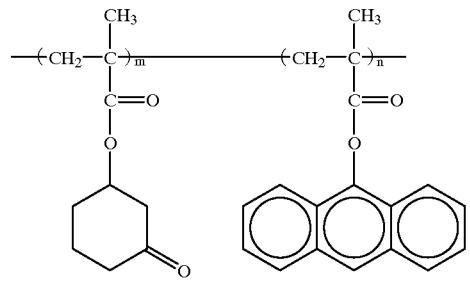

i-59

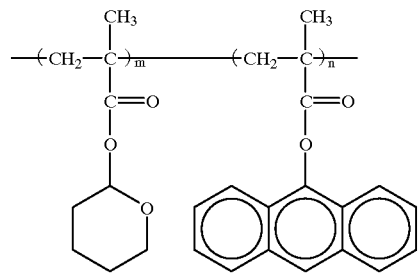

i-60

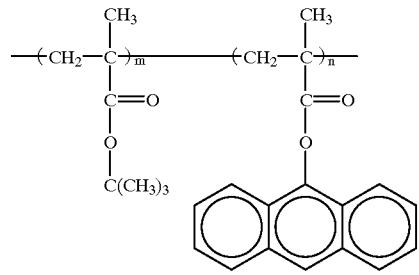

i-61

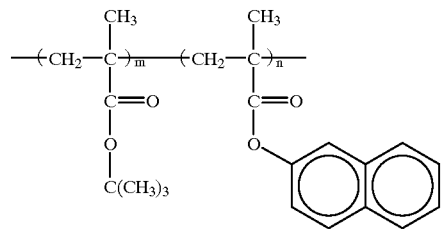

i-62

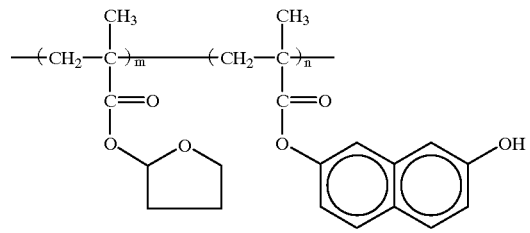

i-63

-continued
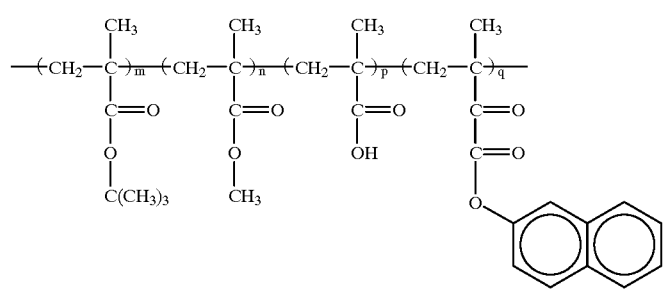
i-64
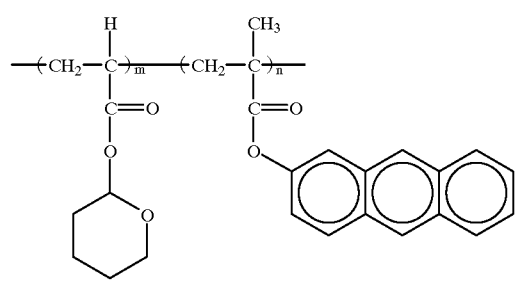
i-65
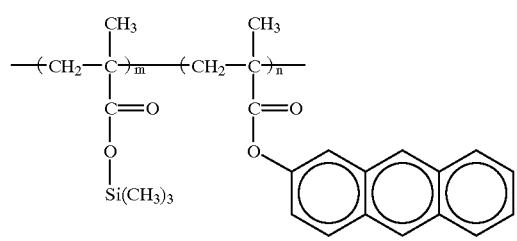
i-66
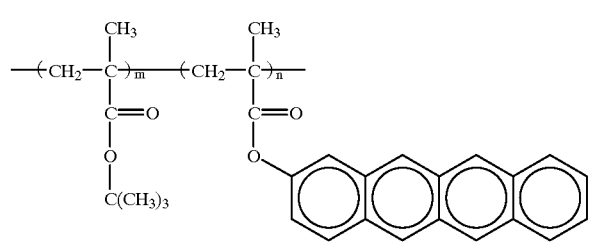
i-67
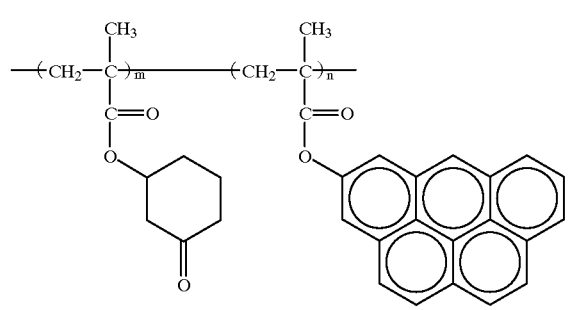
i-68

-continued
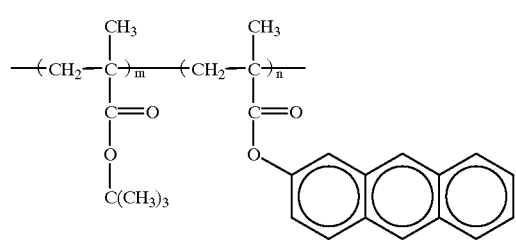
i-69
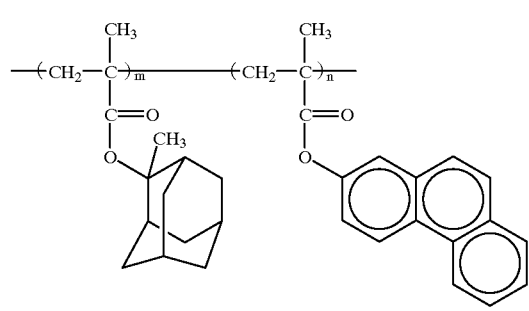
i-70
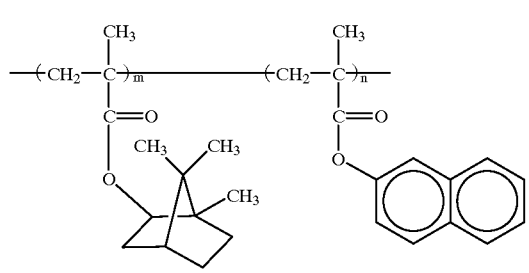
i-71
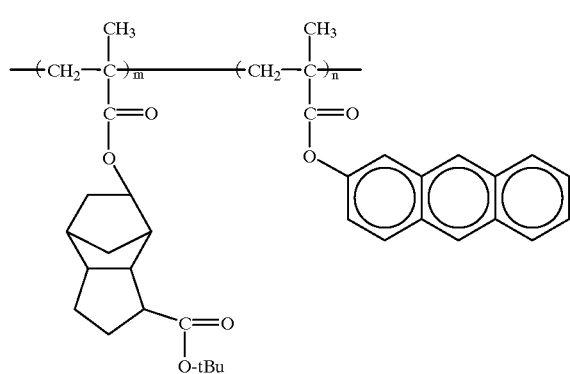
i-72
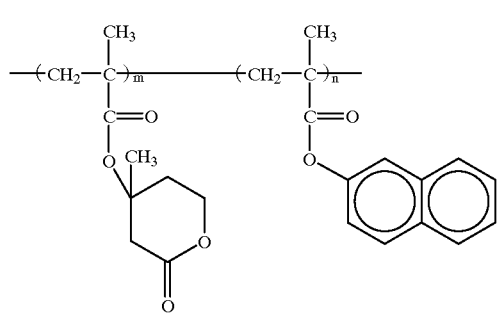
i-73

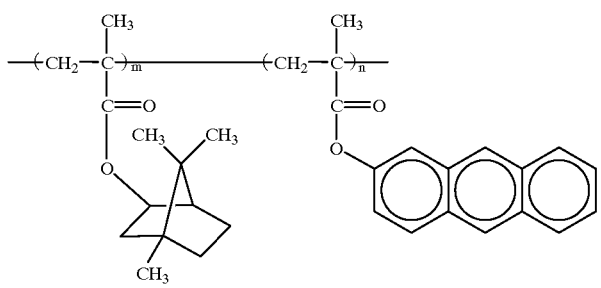

i-74

As for the acid-generating agent that can be employed in the composition according to the first Group of this invention, there is not any particular limitation as long as it is capable of making the solubility inhibiting group alkali-soluble.

Examples of the acid-generating agent are phenylmethyl sulfone, ethylphenyl sulfone, phenypropyl sulfone, methylbenzyl sulfone, benzyl sulfone, dibenzyl sulfone, methyl sulfone, ethyl sulfone, butyl sulfone, methylethyl sulfone, methylsulfonyl acetonitrile, phenylsulfonyl acetonitrile, toluenesulifonyl acetonitril, benzylsulfonyl acetonitril, nitrophenylsulfonyl acetonitrile, florophenylsulfonyl acetonitrile, chlorophenylsulfonyl acetonitrile, methoxyphenylsulfonyl acetonitrile, α-methylphenylsulfonyl acetonitrile, ethylsulfonyl acetonitrile, methylthiomethyl-p-toluyl sulfone, phenylsulfonylacetophenone, phenylsulfonylpropionitrile, phenylsulfonyl propionic acid and esters thereof, bromomethyl-2-(phenylsulfonylmethyl) benzene, naphthylmethyl sulfone, 1-methyl-2-((phenylsulfonyl)methyl)benzene, trimethyl-3-(phenylsulfonyl)orthopropionate, bis(phenylsulfonyl) methane, bis(methylsulfonyl) methane, bis(ethylsulfonyl) methane, (methylsulfonyl)(phenylsulfonyl) methane, phenylsulfonyl acetophenone, methylsulfonyl acetophenone, tris(phenylsulfonyl) methane, phenylthio-bis (phenylsulfonyl)-methane, phenylmerkapto-bis (methylsulfonyl)-methane, tris(methylsulfonyl) methane, tris(ethylsulfonyl) methane, bis(phenylsulfonyl)-methylsulfonyl-methane, bis(methylsulfonyl)-phenylsulfonyl-methane, phenylsulfonyl-ethylsulfonyl-methylsulfonyl-methane, tris(4-nitrophenylsulfonyl) methane, tris(2,4-nitrophenylsulfonyl) methane, bis (phenylsulfonyl)-(4-nitrophenylsulfonyl)-methane, bis (phenylsulfonyl)-(3-nitrophenylsulfonyl)-methane, bis (phenylsulfonyl)-(2-nitrophenylsulfonyl)-methane, bis (methylsulfonyl)-(4-fluorophenylsulfonyl)-methane, bis (phenylsulfonyl)-(4-chlorophenylsulfonyl)-methane, bis (phenylsulfonyl)-(4-fluorophenylsulfonyl)-methane, 1,1,1-tris(phenylsulfonyl) ethane, etc.

It is also possible to employ the compounds represented by the following chemical formulas.

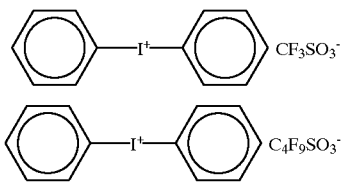

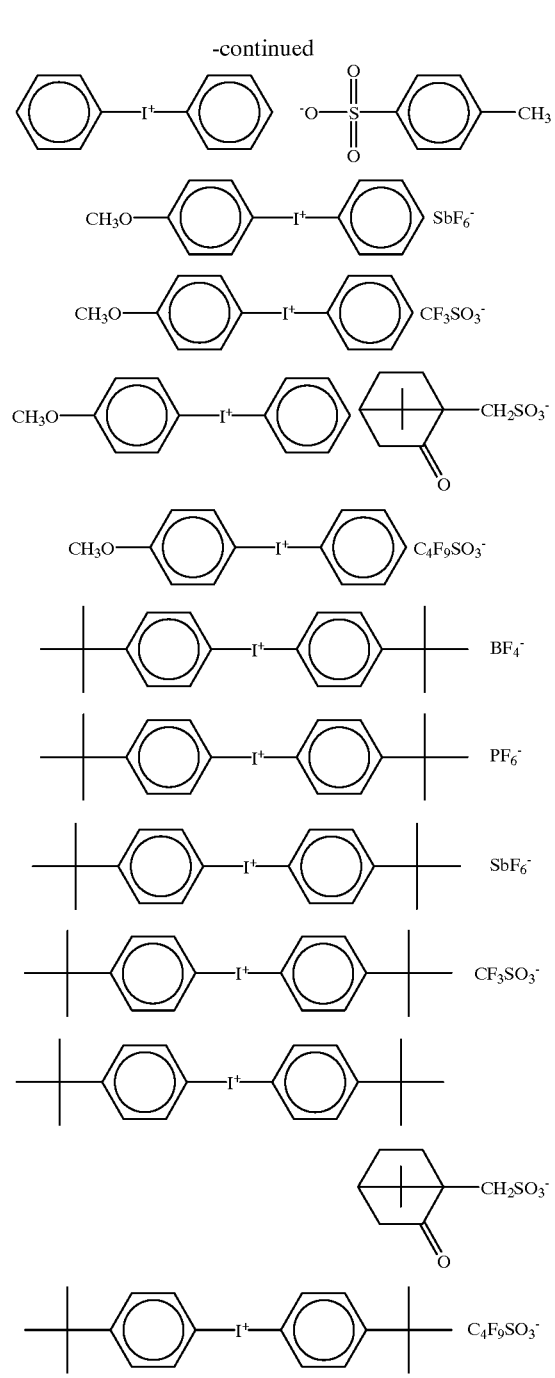

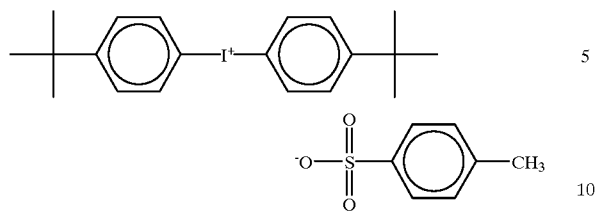
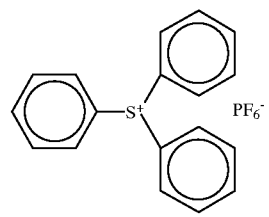
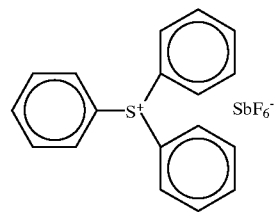
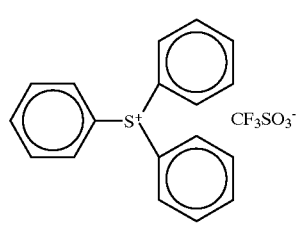
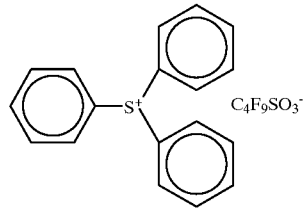
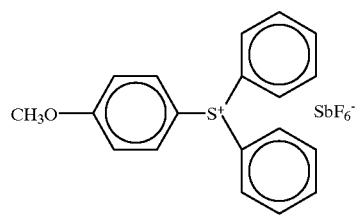
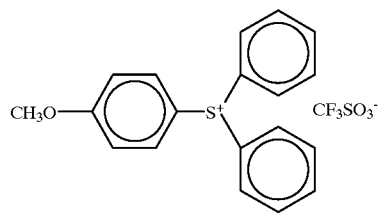
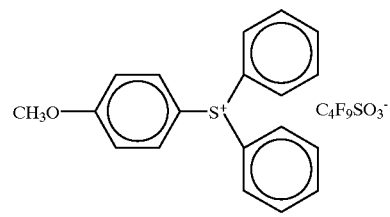
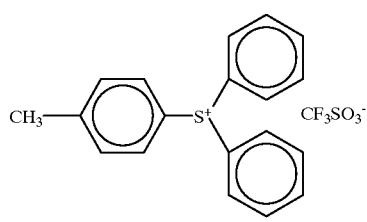
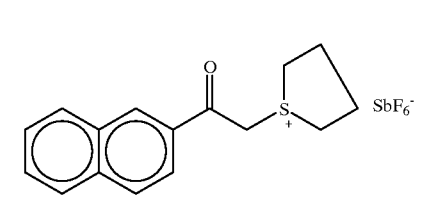
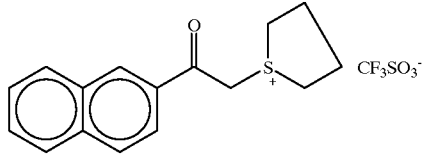
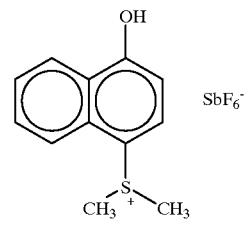
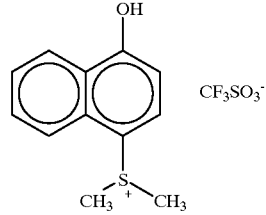
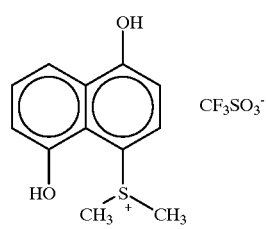

33
-continued
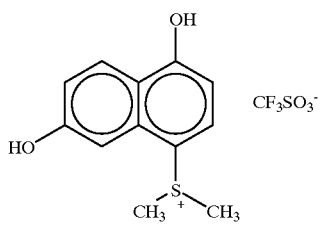
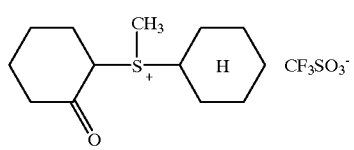
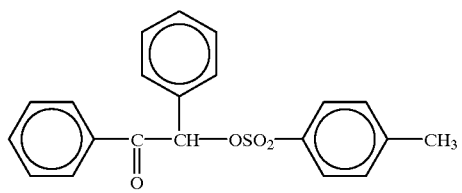
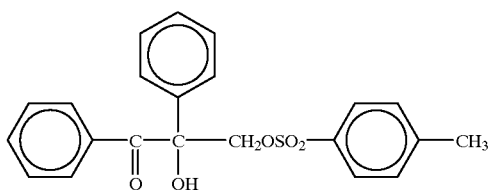
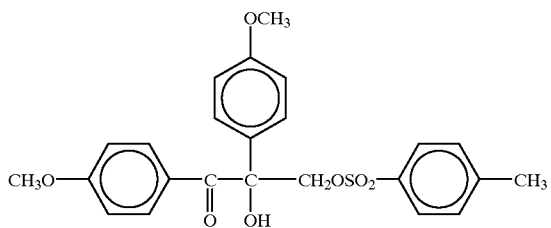
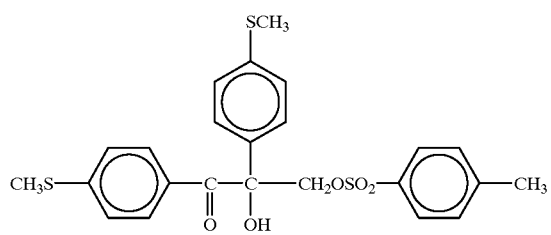
34
-continued
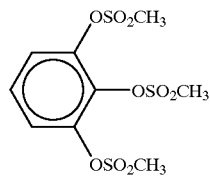
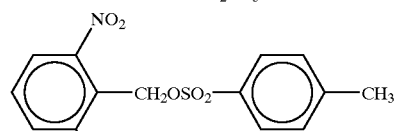
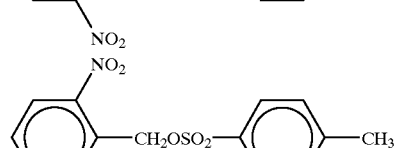
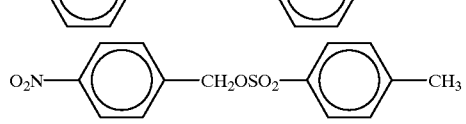
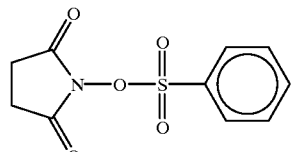
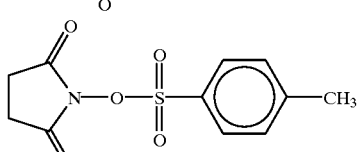
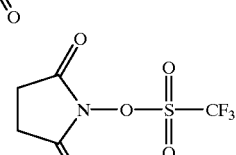
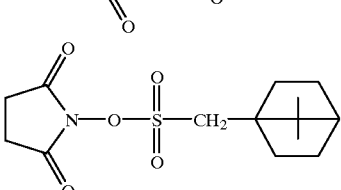
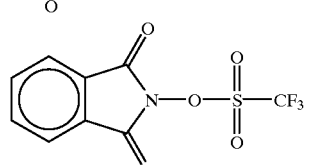
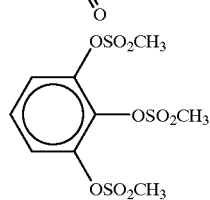

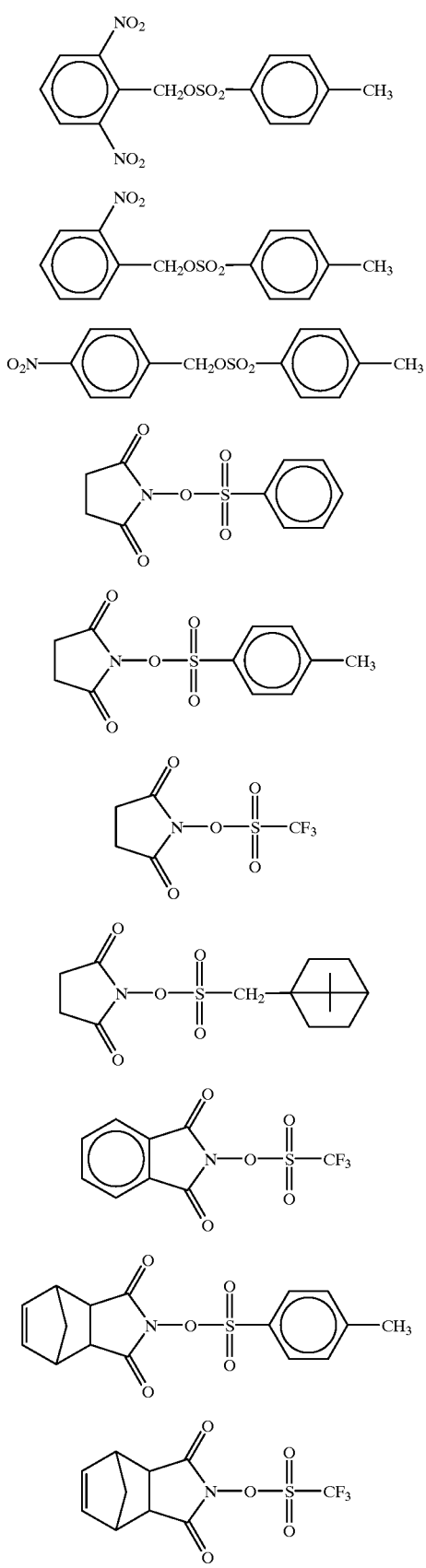
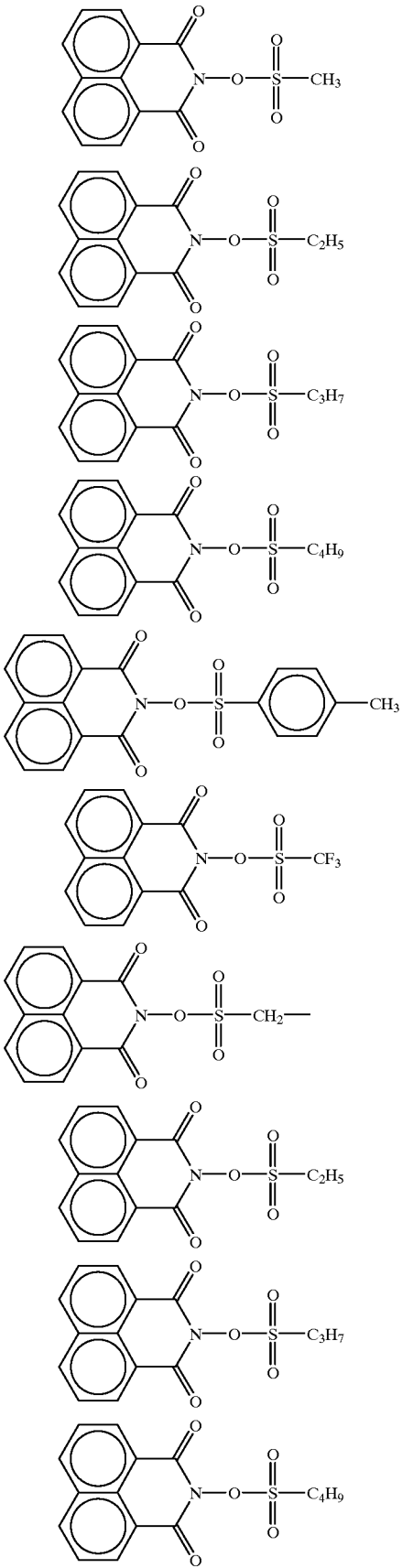

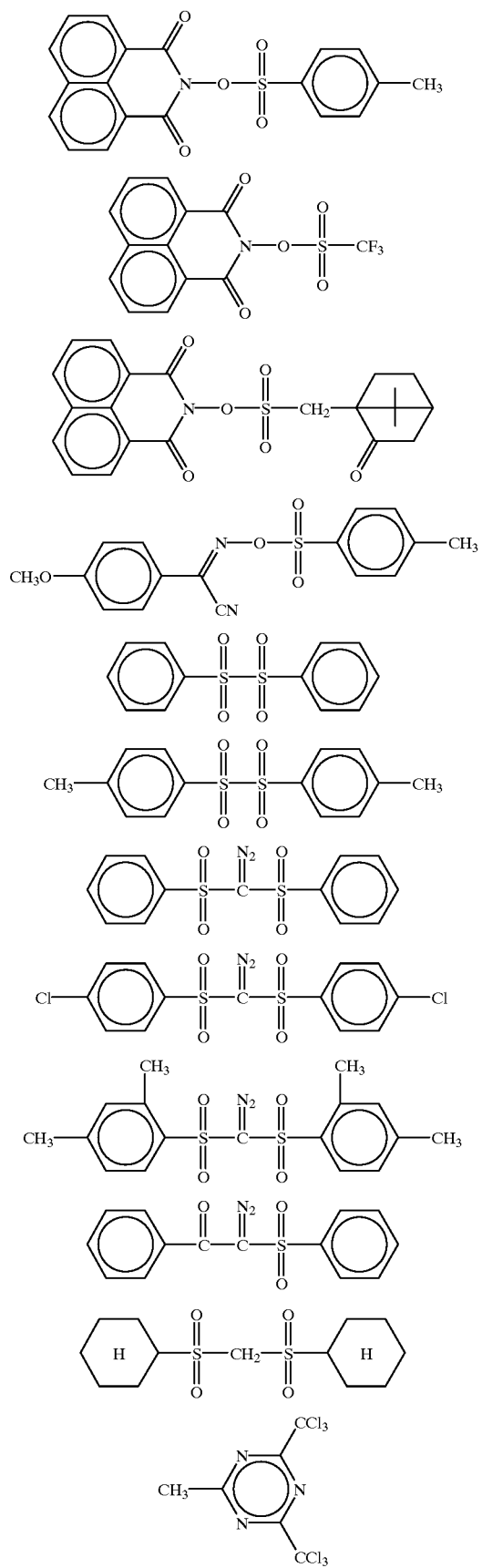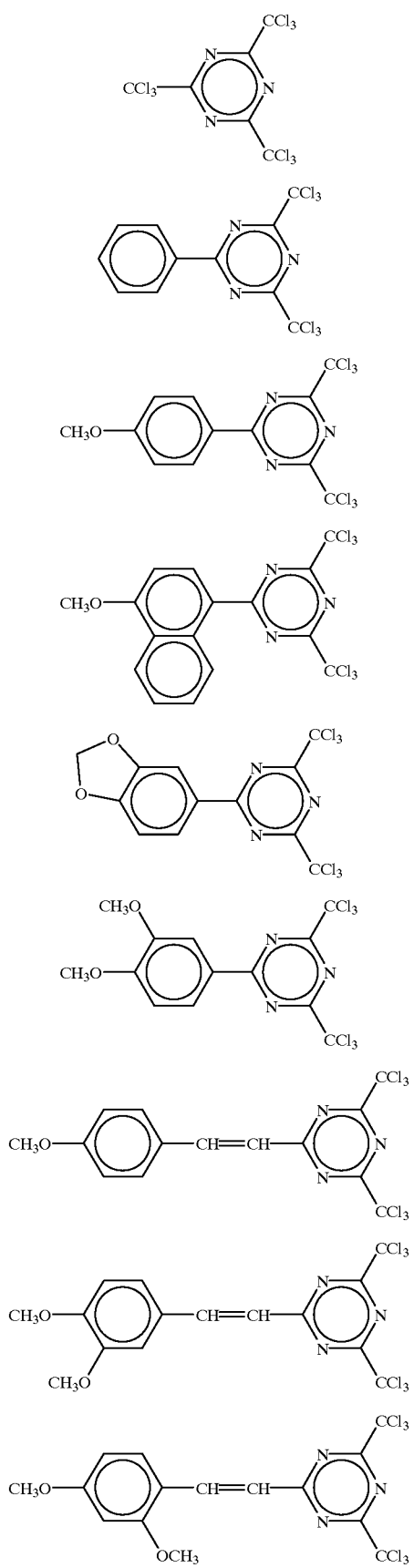

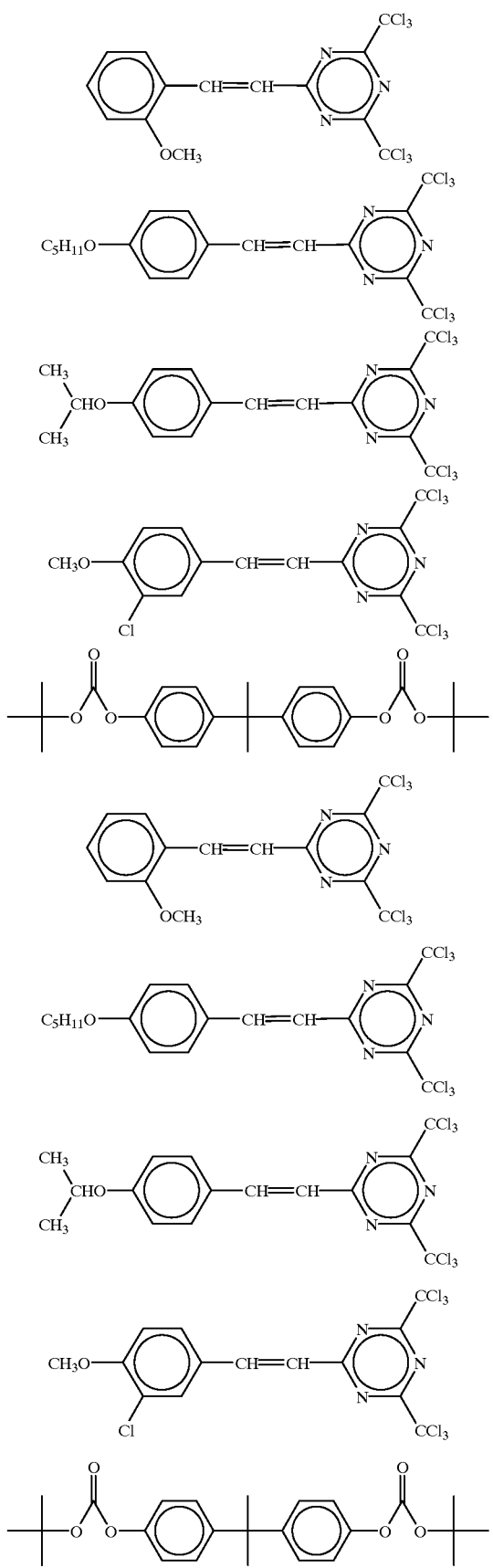

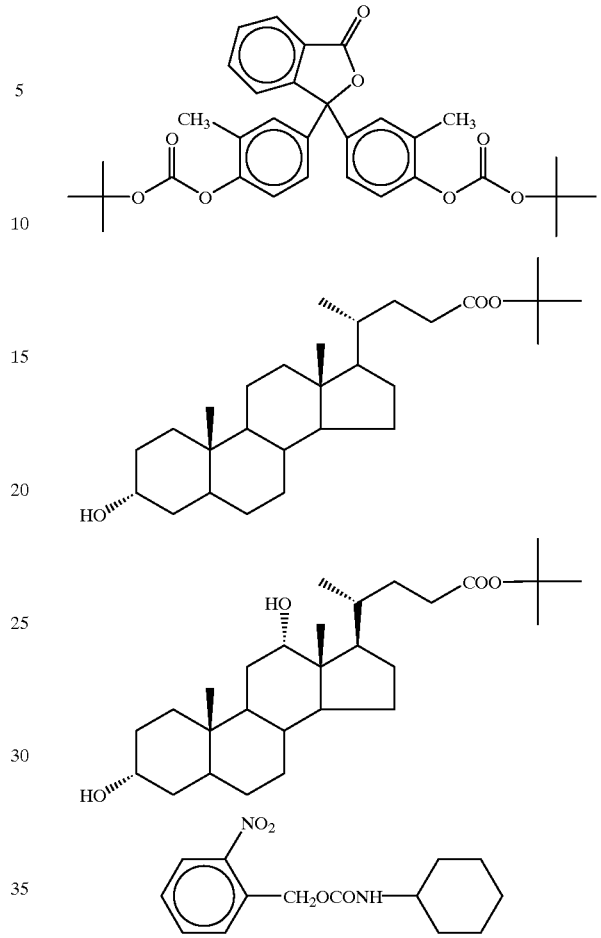

The mixing ratio of these photo-acid-generating agents should preferably be in the range of 0.001 to 40 parts by weight per 100 parts by weight of solid matters in the underlying film composition. Because if the mixing ratio of these photo-acid-generating agents is less than 0.001 part by weight, it may become difficult to sufficiently decompose the solubility inhibiting agent in the underlying film, thus possibly deteriorating the resolution. On the other hand, if the mixing ratio of these photo-acid-generating agents exceeds over 40 parts by weight, the coating property of the underlying film is likely to be deteriorated.

The composition according to the first Group of this invention may contain, in addition to the aforementioned components, an alkali-soluble resin. Preferable examples of the alkali-soluble resin are those whose dissolving velocity to an alkali-developing solution (for example, a 2.38 wt % aqueous solution of tetramethyl ammonium hydroxide) is in the range of 0.1 to 500 nm/sec.

Generally, a phenolic resin can be employed as an alkali-soluble resin. Specific examples of phenolic resin useful in this case are phenolic novolak resin; cresol novolak resin; xylenol novolak resin; polyvinylphenol resin; isopropylphenol resin; a copolymer of vinylphenol which is copolymerized with acrylic acid, methacrylic acid derivatives, acrylonitrile or styrene derivatives; and a copolymer of isopropenylphenol which is copolymerized with acrylic acid, methacrylic acid derivatives, acrylonitrile or styrene derivatives. More specific examples of these phenolic resins are poly(p-vinylphenol), a copolymer of p-isopropenylphenol and acrylonitrile, a copolymer of p-isopropenylphenol and styrene, a copolymer of p-vinylphenol and methylmethacrylate, and a copolymer of p-vinylphenol and styrene.

It is also possible to employ a silicon-containing alkali-soluble polymer such as a novolak resin which can be synthesized from polysiloxane or polysilane each having phenol on its side chain, or from phenol having silicon on its side chain.

It is also possible to employ other kinds of polymer which are similar to the aforementioned alkali-soluble resins. For example, it is possible to employ a novolak resin produced through a polycondensation of a phenol derivative using formaldehyde under an acidic condition and containing, in its skeleton, xylenol, ethylphenol, butylphenol, halogenized phenol or naphthol. Furthermore, it is also possible to employ melamine-formaldehyde resin, poly-4-hydroxymaleimide, a copolymer of vinylphenol and acrylic acid, a copolymer of vinylphenol and methacrylic acid, a copolymer of a vinyl compound and polyacrylic acid, a copolymer of a vinyl compound and methacrylic acid, and a polyimide precursor (polyamic acid).

It would be preferable in this invention to employ an alkali-soluble resin having a polycyclic aromatic hydrocarbon group which is attached to the backbone chain or side chain thereof, if the light exposure is to be performed using a light source having a wavelength of 240 to 450 nm. The reason is that the polycyclic aromatic hydrocarbon group is superior in absorbency to the exposure light, thus enabling to effectively inhibit the reflection of exposure light to a resist film. Followings are specific examples of such an alkali-soluble resin.

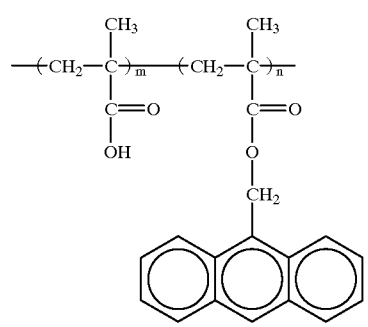

p-7
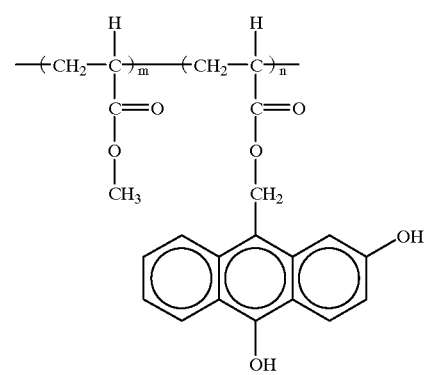
p-8
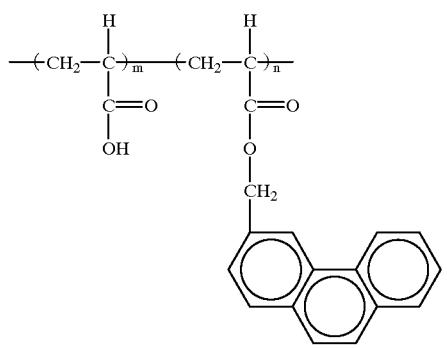
p-9
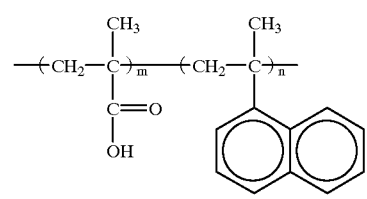
p-10
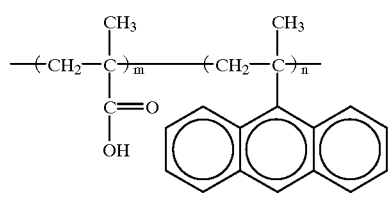
p-11
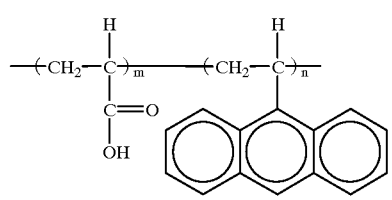
p-12
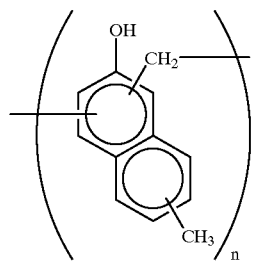
p-13
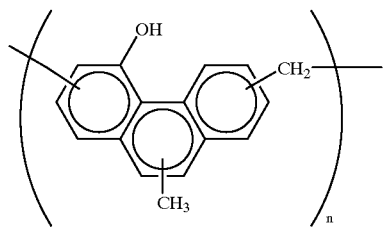
p-14
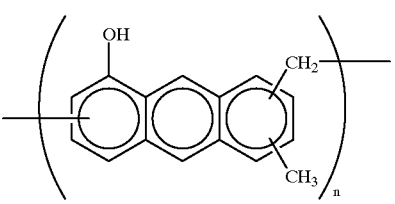
p-15
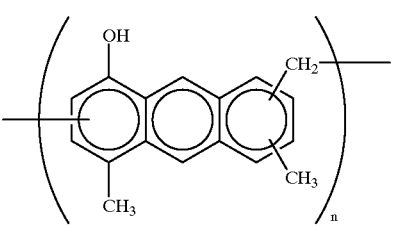
p-16
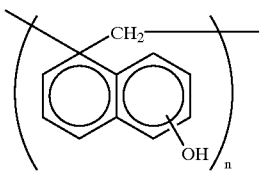
p-17
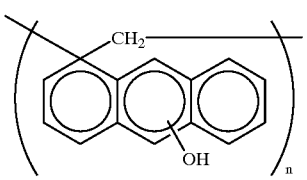

wherein m and n denote respectively a positive integer, representing respectively a polymerization degree or a component ratio of copolymers (polymerization ratio).

These alkali-soluble resins can be employed singly or in combination of two or more kinds.

The mixing ratio of these alkali-soluble resins should preferably be less than 50 parts by weight per 1 part by weight of the solubility inhibiting agent. Because if the mixing ratio of these alkali-soluble resins is 50 parts by weight or more, the resolution of the underlying film would be badly affected. By the way, if the aforementioned solubility inhibiting agent is formed of an alkali-soluble high molecular compound, the solubility inhibiting agent can be employed also as a resin component in the underlying film composition, i.e. as an alkali-soluble resin.

The composition according to the first Group of this invention can be prepared by dissolving a compound having a substituent group which is adapted to be decomposed by an acid and capable of generating an alkali-soluble group after the decomposition thereof and a photo-acid-generating agent, optionally together with an alkali-soluble resin, in an organic solvent thereby to obtain a solution, and then by filtering the solution. Examples of the organic solvent useful in this case are a ketone type solvent such as cyclohexanone, acetone, methylethyl ketone and methylisobutyl ketone; a Cellosolve type solvent such as methyl Cellosolve, methyl Cellosolve acetate, ethyl Cellosolve acetate and butyl Cellosolve acetate; an ester type solvent such as ethyl acetate, butyl acetate, isoamyl acetate and $\gamma$-butyl lactone; dimethyl sulfoxide; dimethyl formamide; N-methyl pyrrolidone, etc. These organic solvents can be employed singly or in combination of two or more kinds. Further, these organic solvents may contain a suitable quantity of aliphatic alcohol such as isopropyl alcohol, or xylene, toluene, etc.

The liquid material thus prepared is then coated on the surface of a wafer or substrate by means of spin-coating for instance, and then baked allowing a solvent to evaporate, thus forming an underlying film.

The composition according to a second Group of this invention comprises a compound having a substituent group which is adapted to be cross-linked by an acid, and a photo-acid-generating agent which is capable of generating the aforementioned acid. When this underlying film composition is employed to form an underlying film in the manufacture of a semiconductor device, a resist film is formed on the surface of this underlying film. As for the resist, a negative resist can be employed generally.

Since a compound having a substituent group which is adapted to be cross-linked by an acid is included in the composition according to this second Group of this invention, when an acid is generated from the acid-generating agent in the underlying film as a result of light exposure to a predetermined region of the underlying film and diffuses into the bottom portion of the underlying film, the crosslinking of the acid-crosslinkable compound is allowed to take place, thus rendering the exposure portion of the underlying film to become hardly soluble in an aqueous alkaline solution.

As for the acid-generating agent, the same kinds of compound as explained with reference to the aforementioned first Group can be employed. It is also possible, as in the case of the composition according to he aforementioned first Group, to incorporate an alkali-soluble resin in the composition of the second Group of this invention.

As for the compound having a substituent group which is adapted to be cross-linked by an acid, that can be employed in the composition according to this second Group, aminoplast resin can be employed. As specific examples of this aminoplast resin, melamine-formaldehyde resin, urea-formaldehyde resin, glycol-formaldehyde resin, benzoguanamine-formaldehyde resin, etc. can be employed. These resins can be employed singly or in combination of two or more kinds. As an aminoplast resin which is available, Cymel Beetle series (American Cyanamide Co., Ltd.), etc. are known.

The mixing ratio of the acid-crosslinkable compound in the composition of the second Group of this invention should preferably be in the range of 10 to 99.999 parts by weight per 100 parts by weight of solid matters in the underlying film composition. Because if the mixing ratio of the acid-crosslinkable compound is less than 10 parts by weight, the crosslinking may become insufficient, so that it may become difficult to secure a sufficient anisotropy and hence to achieve a fine patterning of the underlying film. On the other hand, if the mixing ratio of the acid-crosslinkable compound exceeds over 99.999 parts by weight, the ratio of a photo-acid-generating agent to be included in the underlying film would become too low, so that the crosslinking may become insufficient, thus making it difficult to secure a sufficient anisotropy and hence to achieve a fine patterning of the underlying film.

The mixing ratio of the alkali-soluble resin to be mixed into the composition of the second Group should preferably be less than 50 parts by weight per 1 part by weight of the compound having a substituent group to be crosslinked by an acid. Because if the mixing ratio of the alkali-soluble resin is 50 parts by weight or more, the dissolving velocity of the non-exposure portion becomes too fast so that the contrast of pattern may be deteriorated.

The composition according to the second Group of this invention can be prepared in the same manner as in the case of the first Group, i.e. by dissolving a compound having a substituent group which is adapted to be cross-linked by an acid and a photo-acid-generating agent, optionally together with an alkali-soluble resin, in an organic solvent thereby to obtain a solution, and then by filtering the solution.

The composition according to a third Group of this invention comprises a compound having a substituent group which is adapted to be decomposed by an acid and capable of generating an alkali-soluble group after the decomposition thereof, and a photo-acid-generating agent which is capable of generating the aforementioned acid, wherein a polycyclic aromatic hydrocarbon group is further included in the composition.

As for the compound having a substituent group which is adapted to be decomposed by an acid and capable of generating an alkali-soluble group after the decomposition thereof, the same kinds of compound as explained with reference to the aforementioned first Group can be employed. As for the acid-generating agent, it is also possible to employ the same kinds of compound as explained with reference to the aforementioned first Group.

The polycyclic aromatic hydrocarbon group may be incorporated into the composition by attaching it to a third component which is different from the aforementioned solubility inhibiting agent, alkali-souble resin and acid-generating agent. Namely, the composition according to the third Group of this invention may be essentially consisted of three components, i.e. a solubility inhibiting agent, a photo-acid-generating agent and a compound having a polycyclic aromatic hydrocarbon group.

As for the compound having a polycyclic aromatic hydrocarbon group, it is possible to employ anthracene; naphthacene; naphthalene; phenanthrene; any of these compounds having a substituent group selected from the group consisting of —CH₃, —CN, —COOH, —Cl, NO₂, —NH₂, —CHO, —COCH₃ and —OH; and anthraquinone dye such as Threne Red 5GK, Threne Brown R, Threne Red Violet RPK, Threne Brilliant Green B, etc.

The mixing ratio of the compound having a polycyclic aromatic hydrocarbon group in the composition of the third Group of this invention should preferably be in the range of 0.1 to 95 parts by weight per 100 parts by weight of solid matters in the underlying film composition. Because if the mixing ratio of the compound is less than 0.1 part by weight, it may become difficult to secure a sufficient absorbency to a light having a wavelength of 240 to 450 nm, which is required for acting as an anti-reflective film at the occasion of the exposure of resist film. On the other hand, if the mixing ratio of the compound exceeds over 95 parts by weight, the contrast of pattern may be deteriorated at the occasion of selectively dissolving the exposure portion using an alkaline solution, thus making it impossible to obtain a pattern excellent in configuration after developing treatment.

It would be preferable in the composition of this third Group to employ a resin having a polycyclic aromatic hydrocarbon group attached to the backbone chain or side chain thereof. The reason is that, when a resist solution is coated on the surface of an underlying film and then baked, a compound having a polycyclic aromatic hydrocarbon group may diffuse into the resist film, thus deteriorating the resolution property of the resist film.

Examples of a resin having a polycyclic aromatic hydrocarbon group are the aforementioned alkali-soluble resins (Compounds (p-1) to (p-17)) and the aforementioned solubility inhibiting agents (Compounds (i-54) to (i-74)) which can be incorporated into the compositions of the first Group.

Since the composition of the third Group contains a compound having a polycyclic aromatic hydrocarbon group which is superior in absorbency to a light of 240 to 450 nm in wavelength, it is possible to effectively inhibit the reflection of exposure light to the resist film. Therefore, the composition of the third Group is particularly suited for use as an anti-reflective film when a resist pattern is to be formed using a light having a wavelength ranging from 240 to 450 nm.

Moreover, the compound having a polycyclic aromatic hydrocarbon group that is to be incorporated into the composition of the third Group is highly transparent to a light having a wavelength ranging from 150 to 230 nm, so that if a light having a wavelength of this range is employed in a patterning exposure of an underlying film, even the bottom of the underlying film can be exposed to the light.

Because of this, it is preferable to employ a compound represented by the aforementioned general formula (1) as a compound having a substituent group which is adapted to be decomposed by an acid and capable of generating an alkali-soluble group after the decomposition thereof. Specifically, it is desired to employ, in the composition of the third Group, the aforementioned solubility inhibiting agents (Compounds (i-59) to (i-74)) which can be incorporated into the compositions of the first Group.

The composition according to the third Group of this invention can be prepared in the same manner as in the case of the first Group, except that a compound having a polycyclic aromatic hydrocarbon group or a solubility inhibiting agent having a polycyclic aromatic hydrocarbon group is further mixed in the composition.

Followings are explanation on the method of forming a pattern according to this invention.

A method of forming a pattern according to a first Method of this invention comprises the steps of;

forming an underlying film on a work film;

forming a resist film on said underlying film;

exposing said underlying film and said resist film to a patterning exposure light; and developing predetermined regions thus exposed of said resist film and said underlying film with a developing solution;

which is further featured in that said underlying film has a property that the solubility thereof to said developing solution can be changed by an action of an acid; and that said resist film and/or said underlying film contains a compound which is capable of generating said acid.

There is not any particular limitation on the kind of the work film to be employed in the method of forming a pattern according to the first Method of this invention. Namely, it is possible to employ a silicon oxide film, a silicon nitride film, a silicon oxynitride film, a spin-on-glass, a silicon-based insulating film to be used as a blank material in the manufacture of a mask, a silicon-based material (such as amorphous silicon, polysilicon (polycrystalline Si) or silicon substrate), or a wiring or electrode material (such as aluminum, aluminum silicide, copper, tungsten, tungsten silicide, cobalt silicide and ruthenium).

The underlying film to be formed on the surface of these work film is featured in that the solubility thereof to a developing solution changes by an action of acid. Thus, the underlying film is constituted by an underlying film composition having a group that can be decomposed by an acid, or a group that becomes crosslinkable by an acid.

As for the underlying film composition having a group that can be decomposed by an acid, for example, the same compositions as those of the first Group can be employed. Namely, compositions comprising a compound having a substituent group which is adapted to be decomposed by an acid and a photo-acid-generating agent which is capable of generating the aforementioned acid can be employed. In this case, a resist film consisting of a positive resist composition can be formed on the surface of the underlying film.

Next, the process of forming a pattern according to the first Method of this invention and using a composition of the first Group and a positive resist composition will be explained with reference to drawings.

FIGS. 2A to 2D illustrate cross-sectional views sequentially showing one process of forming a pattern according to the first Method of this invention.

As shown in FIG. 2A, first of all, an underlying film 2a is formed on a work film 1 formed in advance on a substrate. This underlying film 2a a can be formed by coating a composition mentioned above by means of a spin-coating or a dipping and then baking, if required, at a predetermined temperature.

Then, as shown in FIG. 2B, a resist film 3a is formed on the surface of the underlying film 2a. There is not any particular limitation on the kind of resist composition for forming the resist film 3a as long as it can be patterned using a visible radiation or an ultraviolet radiation. Specific examples of the positive resist are a resist comprising naphthoquinone diazide and novolak resin (IX-770, JSR Co.); a chemically amplified type resist composition comprising polyvinylphenol resin protected by t-BOC and a photo-acid-generating agent (APEX-E, Shipley Co.); and a resist composition comprising a polyvinylphenol resin formed of a copolymerized product of tertiary butyl-methacrylate and a photo-acid-generating agent (UVIIHS, Shipley Co.).

Any one of these resist solutions is coated on the underlying film 2a by means of a spin coating method, a dipping method, etc. and then baked if required at a predetermined temperature thereby to form a resist film 3a.

Then, as shown in FIG. 2C, a patterning exposure is performed on the resist film 3a and on the underlying film 2a. Namely, an exposure light 4 is irradiated through a mask having a desired pattern onto the resist film 3a and the underlying film 2a. As for this exposure light 4, it may be a visible radiation or an ultraviolet radiation. As for the light source for irradiating an ultraviolet radiation, a mercury lamp, or an excimer laser such as XeF (wavelength=351 nm), XeCl (wavelength=308 nm), KrF (wavelength=248 nm), KrCl (wavelength=222 nm), ArF (wavelength=193 nm) or $F_2$ (wavelength=151 nm) may be employed. It is also possible to employ electron beam, ion beam or X-rays for performing the patterning exposure.

As a result of this patterning exposure, an acid is caused to generate from the acid-generating agent at the exposure portion of the underlying film 2a, and hence a reaction takes place between the acid thus generated and a solution inhibiting agent (a compound having a substituent group capable of being decomposed by an action of acid) included in the underlying film 2a.

It is preferable to perform a baking of the resist film 3a and underlying film 2a after this exposure. As a result of baking, the acid generated from the acid-generating agent in the underlying film 2a is allowed to diffuse into the bottom portion of the underlying film, thus forming a latent image 5a in the resist film 3a and underlying film 2a.

After the latent image 5a is formed in this manner, the resist film 3a and underlying film 2a are subjected to a developing treatment using a predetermined developing solution, thereby to dissolve and remove the portion of latent image 5a, thus forming a pattern as shown in FIG. 2D. As for the developing agent useful in this case, it may be suitably selected depending on the kind of the resist material. For example, it is possible to employ an alkaline developing solution such as tetramethyl ammonium hydroxide, choline, sodium hydroxide, potassium hydroxide, etc.

Since a photo-acid-generating agent is included in the underlying film, when an underlying film composition of the first Group of this invention and a positive resist composition are employed, and the patterning is performed by making use of the first Method of this invention, an acid is generated from the acid-generating agent at the exposure portion of the underlying film due to the effect of the patterning exposure. This acid is then diffused into the bottom portion of the underlying film, thus decomposing the compound (an solubility inhibiting agent) contained in the underlying film. As a result, the exposure portion of the underlying film is turned soluble to an alkaline solution.

As explained above, according to the first Method of this invention for forming a pattern, the solubility of the underlying film to an alkaline solution is caused to change by the diffusion of an acid. Therefore, it is possible to dissolve and remove even the bottom portion of the underlying film where the intensity of exposure light is generally attenuated. Accordingly, it is possible to form a pattern having a perpendicular side wall and an excellent configuration, i.e. a rectangular cross-section.

The resist pattern and underlying film pattern thus formed are then employed as an etching mask for selectively etching the work film 1, thus making it possible to perform a fine working of the work film with a high precision in dimension.

As another kind of underlying film composition containing a group that can be crosslinked by an action of acid and being applicable to the method of forming a pattern according to the first Method of this invention, underlying film compositions of the second Group of this invention can be employed. Namely, the composition according to this second Group comprises a compound having a substituent group which is adapted to be cross-linked by an acid, and a photo-acid-generating agent which is capable of generating the aforementioned acid. In this case, a resist film can be formed on the surface of the underlying film using a negative resist composition.

Next, the process of forming a pattern according to the first Method of this invention and using a composition of the second Group and a negative resist composition will be explained with reference to drawings.

FIGS. 3A to 3D illustrate cross-sectional views sequentially showing another process of forming a pattern according to the first Method of this invention.

Figure 3A:
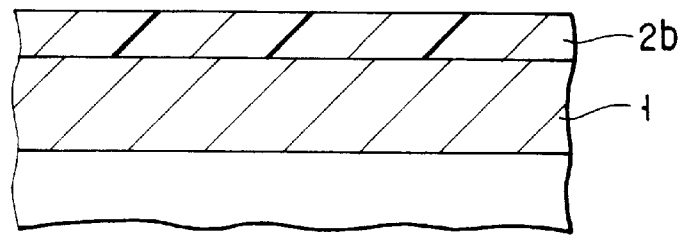
FIGS. 3A to 3D illustrate cross-sectional views sequentially showing the process of forming a pattern according to another example of this invention.

As shown in FIG. 3A, first of all, an underlying film 2b is formed on a work film 1 formed in advance on a substrate. This underlying film 2b can be formed by coating a composition mentioned above by means of a spin-coating or a dipping and then baking, if required, at a predetermined temperature.

Figure 3B:
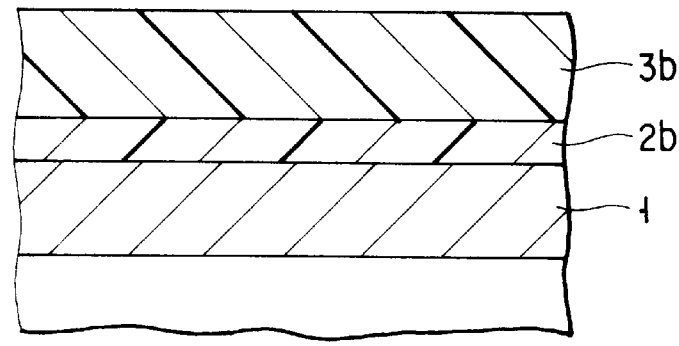

Then, as shown in FIG. 3B, a resist film 3b is formed on the surface of the underlying film 2b. There is not any particular limitation on the kind of resist composition for forming the resist film 3b as long as it can be patterned using a visible radiation or an ultraviolet radiation. Specific examples of the negative resist are, for instance, a chemically amplified type resist comprising polyvinylphenol, melamine resin and a photo-acid generating agent (SNR200, Shipley Co.), and a resist comprising polyvinylphenol and a bisazide compound (RD-2000, Hitachi Kasei Co., Ltd.).

Any one of these resist composition is coated on the underlying film 2b by means of a spin coating method, a dipping method, etc. and then baked if required at a predetermined temperature thereby to form a resist film 3b.

Figure 3C:
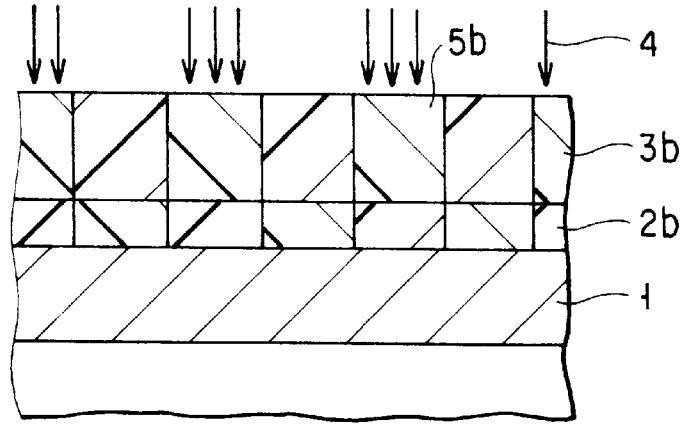

Then, as shown in FIG. 3C, a patterning exposure is performed on the resist film 3b and on the underlying film 2b. Namely, an exposure light 4 is irradiated through a mask having a desired pattern onto the resist film 3b and the underlying film 2b. As for this exposure light 4, it may be a visible radiation or an ultraviolet radiation. As for the light source for irradiating an ultraviolet radiation, a mercury lamp or an excimer laser as mentioned above may be employed. It is also possible to employ electron beam, ion beam or X-rays for performing the patterning exposure.

As a result of this patterning exposure, an acid is caused to generate from the photo-acid-generating agent at the exposure portion of the underlying film 2b, and hence a reaction takes place between the acid thus generated and a compound having a substituent group capable of crosslinking by an action of acid and included in the underlying film 2b.

It is preferable to perform a baking of the resist film 3b and underlying film 2b after this exposure. As a result of baking, the acid generated from the photo-acid-generating agent in the underlying film 2b is allowed to diffuse into the bottom portion of the underlying film, thus forming a latent image 5b in the resist film 3b and underlying film 2b. In this case, the latent image portion formed in the resist film 3b and underlying film 2b is left remained without being dissolved by the developing solution.

Figure 3D:
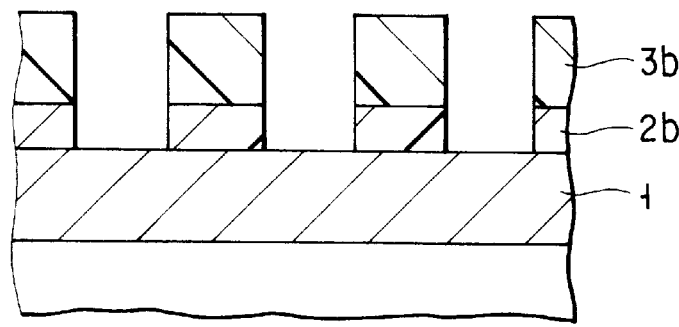

After the latent image 5b is formed in this manner, the resist film 3b and underlying film 2b are subjected to a developing treatment using a predetermined developing solution, thereby to dissolve and remove the portion other than the latent image portion which has been crosslinked, thus forming a pattern as shown in FIG. 3D. As for the developing agent useful in this case, it is possible to employ the same kinds of developing solution as mentioned above.

Since a photo-acid-generating agent is included in the underlying film, when an underlying film composition of the second Group of this invention and a negative resist composition are employed, and the patterning is performed by making use of the first Method of this invention, an acid is generated from the photo-acid-generating agent at the exposure portion of the underlying film due to the effect of the patterning exposure. This acid is then diffused into the bottom portion of the underlying film, thus crosslinking the acid-crosslinkable compound contained in the underlying film. As a result, the exposure portion of the underlying film is turned insoluble to an alkaline solution.

As explained above, according to the first Method of this invention for forming a pattern, the solubility of the underlying film to an alkaline solution is caused to change by the diffusion of an acid. Therefore, it is possible, even at the bottom of the underlying film where the intensity of exposure light is generally attenuated, to dissolve and remove the non-exposure portion, while leaving the exposure portion. Accordingly, it is possible to form a pattern having a perpendicular side wall and an excellent configuration, i.e. a rectangular cross-section.

The resist pattern and underlying film pattern thus formed are then employed as an etching mask for selectively etching the work film 1, thus making it possible to perform a fine working of the work film with a high precision in dimension.

Although the method of forming a pattern according to the first Method of this invention has been explained with reference to the combination of an underlying film composition and a resist material, the method of this invention is not restricted to the aforementioned examples. For example, it is also possible, using a combination of an underlying film composition of the first Group and a positive resist composition, to form a negative pattern by making use of the aforementioned first Method of this invention. In this case, a solvent which is low in polarity such as anisole, toluene, xylene, etc. can be employed as a developing solution. Since the exposure portions of the resist film and underlying film which have been polarized are hardly soluble to a low polarity solvent, a negative pattern can be obtained. When a developing solution of this kind is employed, it is possible to form a negative pattern even if a combination of an underlying film composition of the second Group of this invention and a positive resist composition is employed.

In the method of forming a pattern according to the first Method of this invention, a photo-acid-generating agent is included in at least one of the films, i.e. the underlying film and/or the resist film.

When this acid-generating agent is included in the underlying film, the acid can be easily diffused into even the bottom of the underlying film, and hence an underlying film pattern excellent in configuration can be obtained after a developing treatment.

On the other hand, when this photo-acid-generating agent is included in the resist film, it is required that the acid is allowed to be sufficiently and uniformly diffused into the underlying film so as to cause the acid to react with the solubility inhibiting group or with an acid-crosslinkable group. Therefore, the mixing ratio of the photo-acid-generating agent in the resist should preferably be at least about 0.001 part by weight or more per 100 parts by weight of the solid matters in the resist. However, if the content of the photo-acid-generating agent is excessive, the coating property of the resist may be deteriorated. Therefore, the mixing ratio of the photo-acid-generating agent in the resist should preferably be less than 40 parts by weight per 100 parts by weight of the solid matters in the resist.

If a resist film containing the photo-acid-generating agent is formed on an underlying film, the underlying may not be required to contain a photo-acid-generating agent. The formation of a pattern in this case can be performed in the same manner as mentioned above except that a combination of these underlying film and resist film is employed.

Next, a method of forming a pattern according to the second Method of this invention will be explained.

A method of forming a pattern according to the second Method of this invention comprises the steps of;

forming an underlying film on a work film;

forming a resist film containing a phenolic resin on said underlying film;

exposing said resist film to a patterning exposure light using a first irradiation of light;

developing said resist film thus exposed with a developing solution to form a resist pattern;

exposing said underlying film through said resist pattern used as a mask to a patterning exposure light using a second irradiation of light; and developing an exposed region of said underlying film;

wherein said underlying film is constituted by an underlying film composition containing a compound having a substituent group which is adapted to be decomposed by an acid and capable of generating an alkali-soluble group after the decomposition thereof, and a photo-acid-generating agent which is capable of generating said acid; said underlying film composition further comprising a polycyclic aromatic hydrocarbon group.

There is not any particular limitation on the kind of the work film to be employed in the method of forming a pattern according to the second Method of this invention, so that the same kinds of film as those of the first Method can be employed. Namely, it is possible to employ a silicon oxide film, a silicon nitride film, a silicon oxynitride film, a spin-on-glass, a silicon-based insulating film to be used as a blank material in the manufacture of a mask, a silicon-based material (such as amorphous silicon, polysilicon (polycrystalline Si) or silicon substrate), or a wiring or electrode material (such as aluminum, aluminum silicide, copper, tungsten, tungsten silicide, cobalt silicide and ruthenium).

The underlying film to be formed on the surface of these work film is featured in that the composition is constituted by a compound having a substituent group which is adapted to be decomposed by an acid and capable of generating an alkali-soluble group after the decomposition thereof, and by a photo-acid-generating agent which is capable of generating said acid, wherein a polycyclic aromatic hydrocarbon group is further included in the composition. Namely, the underlying film is formed using an underlying film composition of the third Group of this invention.

Next, the process of forming a pattern according to the second Method of this invention using the aforementioned composition will be explained with reference to drawings.

FIGS. 4A to 4F illustrate cross-sectional views sequentially showing the process of forming a pattern according to the second Method of this invention.

Figure 4A:
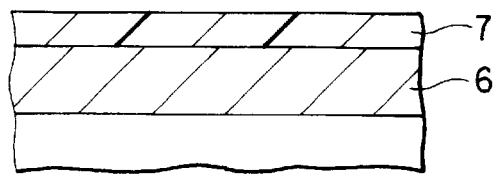
FIGS. 4A to 4F illustrate cross-sectional views sequentially showing the process of forming a pattern according to another example of this invention.

As shown in FIG. 4A, first of all, an underlying film 7 is formed on a work film 6 formed in advance on a substrate. This underlying film 7 can be formed by coating a composition of the third Group by means of a spin-coating or a dipping and then baking, if required, at a predetermined temperature. This underlying film 7 is preferably selected from those having a substituent group which can be decomposed by an acid that can be generated from a photo-acid-generating agent by the irradiation of light having a wavelength ranging from 150 to 230 nm.

Figure 4B:
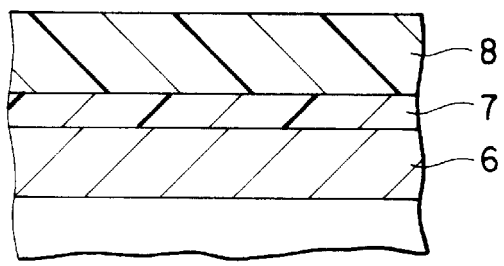

Then, as shown in FIG. 4B, a resist film 8 is formed on the surface of the underlying film 7. As for the resist composition for forming a resist film, a composition comprising a phenolic resin can be employed. Specific examples of such a resist composition are a positive resist comprising naphthoquinone diazide and novolak resin (IX-770, JSR Co.); a chemically amplified type positive resist composition comprising polyvinylphenol resin protected by t-BOC and a photo-acid-generating agent (APEX-E, Shipley Co.); and a chemically amplified type positive resist composition comprising a polyvinylphenol resin formed of a copolymerized product of tertiary butylmethacrylate and a photo-acid-generating agent (UVIIHS, Shipley Co.).

Any one of these resist solutions is coated on the underlying film 7 by means of a spin coating method, a dipping method, etc. and then baked if required at a predetermined temperature thereby to form a resist film 8.

Figure 4C:
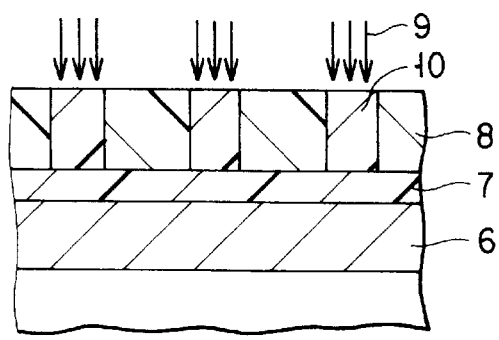

Then, as shown in FIG. 4C, a patterning exposure is performed on the resist film 8. Namely, a first exposure light 9 is irradiated through a mask having a desired pattern onto the resist film 8. As for this exposure light 9, it may be a visible radiation or an ultraviolet radiation. As for the light source for irradiating an ultraviolet radiation, a mercury lamp, or an excimer laser such as XeF (wavelength=351 nm), XeCl (wavelength=308 nm), KrF (wavelength=248 nm), KrCl (wavelength=222 nm), etc. may be employed. It is also possible to employ electron beam, ion beam or X-rays for performing the patterning exposure.

In particular, it is preferable to employ a light having a wavelength ranging from 240 to 450 nm as the aforementioned first exposure light. Namely, since the polycyclic aromatic hydrocarbon group included in the underlying film is capable of absorbing a light having the aforementioned range of wavelength, the underlying film containing the polycyclic aromatic hydrocarbon group can be functioned as an effective anti-reflective film.

As a result of this patterning exposure, a latent image 10 can be formed in the exposure portion of resist film 8.

Figure 4D:
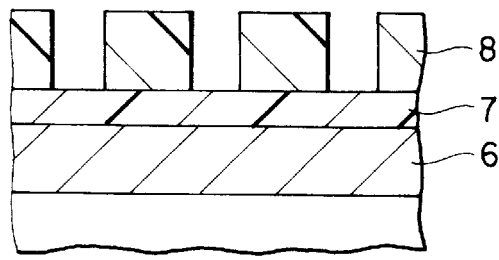

After the latent image 10 is formed in this manner, the resist film 8 is subjected to a developing treatment using a predetermined developing solution, thereby to dissolve and remove the portion of latent image 10, thus forming a resist pattern as shown in FIG. 4D. As for the developing agent useful in this case, it is possible to employ an alkaline developing solution such as tetramethyl ammonium hydroxide, choline, sodium hydroxide, potassium hydroxide, etc.

Figure 4E:
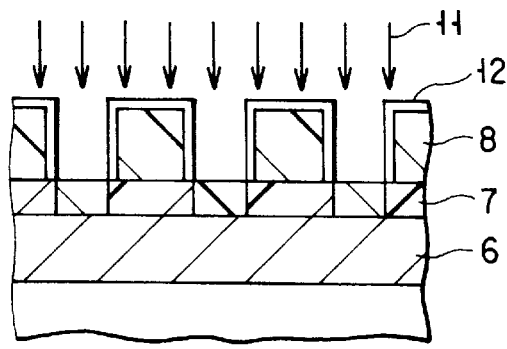

As shown in FIG. 4E, a second exposure light 11 is irradiated onto the underlying film 7 using the aforementioned resist pattern as a mask. As for the second exposure light 11, a light having a wavelength ranging from 150 to 230 nm can be employed. As for the light source for irradiating the second exposure light 11, a mercury lamp, or an ArF excimer laser (wavelength=193 nm), an $F_2$ laser (wavelength=151 nm) or an excimer lamp may be employed.

Since the phenolic resin to be included in the resist film 8 exhibits a high absorbency to the light of these wavelengths, the second exposure light 11 can penetrate into the surface of the resist film at a depth of only several nanometers. Therefore, a crosslinking reaction of the phenolic resin takes place under a light exposure of these wavelength in the surface region of the resist film, whereby forming a superficial crosslinked layer 12.

On the other hand, due to the presence of resist pattern as a mask, the region of underlying film which is covered by the resist pattern cannot be irradiated. On the contrary, the region which is not covered by the resist pattern is exposed to the light thereby forming a latent image in the underlying film.

It is preferable to employ a light having a wavelength ranging from 150 to 230 nm as the aforementioned second exposure light. Namely, since the phenolic resin included in the resist film 8 is capable of effectively absorbing a light of the aforementioned wavelengths, the second exposure light 11 can penetrate into the surface of the resist film at a depth of only several nanometers.

Figure 4F:
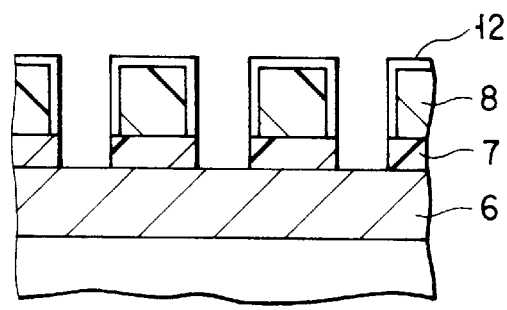

After the latent image is formed in the underlying film, the underlying film is subjected to a developing treatment using a predetermined developing solution, thereby to dissolve and remove the portion of latent image, thus forming a pattern as shown in FIG. 4F. As for the developing agent useful in this case, it may be suitably selected depending on the kind of the resist material. For example, it is possible to employ an alkaline developing solution such as tetramethyl ammonium hydroxide, choline, sodium hydroxide, potassium hydroxide, etc.

In the method of forming a pattern according to the second Method of this invention, the underlying film is formed using an underlying film composition containing a polycyclic aromatic hydrocarbon group. This polycyclic aromatic hydrocarbon group is superior in absorbency to a light of 240 to 450 nm in wavelength and excellent in transparency to a light of 150 to 230 nm in wavelength. Further, the resist film to be formed on the underlying film contains phenolic resin, which is impermeable to a light of 150 to 230 nm in wavelength.

In the method of forming a pattern according to the second Method of this invention, the aforementioned resist film is irradiated at first with a first irradiation of light. Since this first irradiation of light is consisted of a light having a wavelength ranging from 240 to 450 nm, the reflection of exposure light to the resist film can be effectively inhibited by the effect of the underlying film. As a result, a resist pattern excellent in cross-sectional configuration can be obtained.

After a resist pattern is formed in this manner, a second irradiation of light is performed all over the resist pattern. This second irradiation of light is consisted of a light having a wavelength ranging from 150 to 230 nm. Since the phenolic resin to be included in the resist pattern is impermeable to a light of 150 to 230 nm in wavelength, the resist pattern can be functioned as a mask. Therefore, the region of the underlying film which is not covered by the resist pattern can be selectively exposed to the light, thus turning the exposure portion of the underlying film soluble to an alkaline solution. Furthermore, since the underlying film contains a polycyclic aromatic hydrocarbon group which is excellent in transparency to a light of 150 to 230 nm in wavelength, even the bottom portion of the underlying film can be exposed to light even if the underlying film is relatively large in thickness. Furthermore, when the second irradiation of light is performed, an acid is caused to generate from the photo-acid-generating agent contained in the underlying film, and the acid thus generated can be diffused into the bottom portion of this underlying film. Therefore, it is possible, even if the thickness of the underlying film is relatively large, to form a pattern having a perpendicular side wall and an excellent configuration, i.e. rectangular in cross-section.

The resist pattern and underlying film pattern thus formed are then employed as an etching mask for selectively etching the work film 6, thus making it possible to perform a fine working of the work film with a high precision in dimension.

The method of forming a pattern according to the second Method of this invention is also suitably applicable to a hybrid exposure wherein a resist film is irradiated using an electric charge beam in addition to an exposure light.

This charging beam may be ion beam or electron beam. The irradiation of this charging beam onto the resist film can be performed before the aforementioned first irradiation of light is performed to the resist film, or after the aforementioned first irradiation of light is performed to the resist film. When the irradiation of this charging beam onto the resist film is performed, the acid-generating agent contained in the underlying film is decomposed thereby to generate a conductive material at the exposure portion of the underlying film. Since electric charge is allowed to escape outward by the presence of this conductive material, any misregistration due to an accumulation of electric charge can be inhibited. Therefore, it is possible to form a resist pattern having a perpendicular side wall and an excellent configuration, i.e. rectangular in cross-section after the developing treatment of the resist film.

Next, a method of forming a pattern according to the third Method of this invention will be explained.

A method of forming a pattern according to the third Method of this invention comprises the steps of;

forming an underlying film on a work film, said underlying film containing a compound having a substituent group which is adapted to be decomposed by an acid and capable of generating an alkali-soluble group after the decomposition thereof, and a photo-acid-generating agent which is capable of generating said acid;

forming a resist film containing a phenolic resin on said underlying film;

exposing said resist film to an electric charge beam;

developing said resist film thus exposed to form a resist pattern;

exposing said underlying film through said resist pattern used as a mask to an irradiation of light; and developing an exposed region of said underlying film;

There is not any particular limitation on the kind of the work film to be employed in the method of forming a pattern according to the third Method of this invention, so that the same kinds of film as those of the second Method can be employed. Namely, it is possible to employ a silicon oxide film, a silicon nitride film, a silicon oxynitride film, a spin-on-glass, a silicon-based insulating film to be used as a blank material in the manufacture of a mask, a silicon-based material (such as amorphous silicon, polysilicon (polycrystalline Si) or silicon substrate), or a wiring or electrode material (such as aluminum, aluminum silicide, copper, tungsten, tungsten silicide, cobalt silicide and ruthenium).

The underlying film is formed on the surface of these work film using a composition that is constituted by a compound having a substituent group which is adapted to be decomposed by an acid and capable of generating an alkali-soluble group after the decomposition thereof, and by a photo-acid-generating agent which is capable of generating said acid. Namely, the underlying film is formed using an underlying film composition of the first Group of this invention.

The formation of a pattern by making use of this third Method of this invention can be performed in the same manner as in the second Method of this invention, except that the underlying film is formed using the composition of the first Group of this invention, and that the first irradiation of light is replaced by an electric charge beam, and that the second irradiation of light is performed employing a predetermined light.

The charging beam to be employed in the third Method of this invention may be ion beam or electron beam.

When the irradiation of this charging beam is performed, the acid-generating agent contained in the underlying film is decomposed thereby to generate a conductive material at the exposure portion of the underlying film. Since electric charge is allowed to escape outward by the presence of this conductive material, any misregistration due to an accumulation of electric charge can be inhibited. Therefore, it is possible to form a resist pattern having a perpendicular side wall and an excellent configuration, i.e. rectangular in cross-section after the developing treatment of the resist film.

The light to be irradiated onto the underlying film using the resist pattern formed as mentioned above should preferably be a light having a wavelength ranging from 150 to 230 nm in wavelength. Because, since the phenolic resin to be included in the resist pattern is impermeable to a light of this range of wavelength, the resist pattern can be functioned as a mask.

Furthermore, when the second irradiation of light having the aforementioned wavelength is performed, an acid is caused to generate from the photo-acid-generating agent contained in the underlying film, and the acid thus generated can be diffused into even the bottom portion of this underlying film. Therefore, it is possible, even if the thickness of the underlying film is relatively large, to form a pattern having a perpendicular side wall and an excellent configuration, i.e. rectangular in cross-section.

The resist pattern and underlying film pattern thus formed are then employed as an etching mask for selectively etching the work film 6, thus making it possible to perform a fine working of the work film with a high precision in dimension.

Followings are components employed in the following Examples and Comparative Examples.

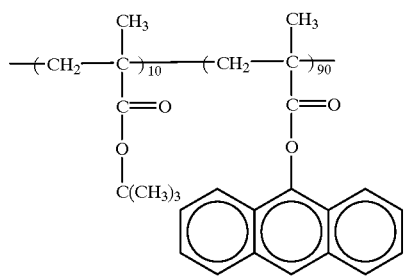
1-1
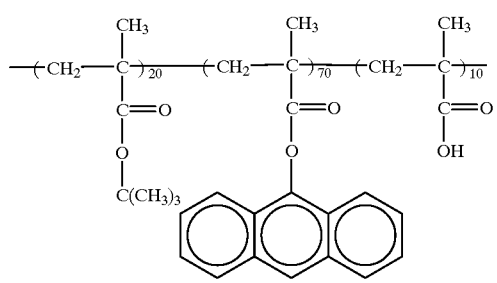
1-2
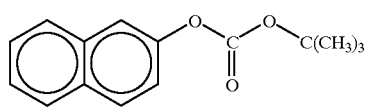
1-3
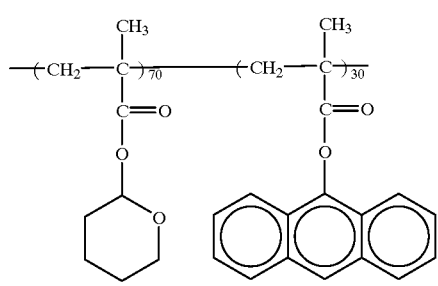
1-4
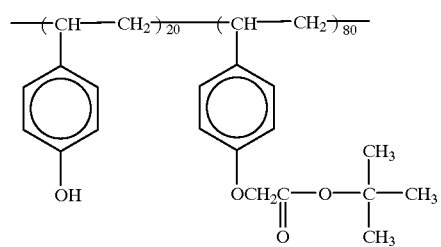
1-5
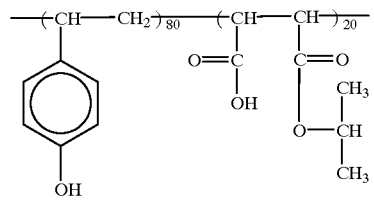
1-6

1-7
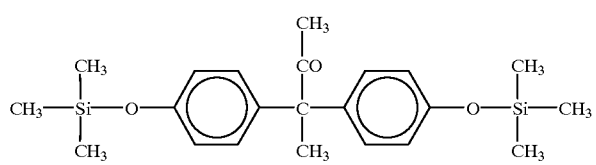
1-8
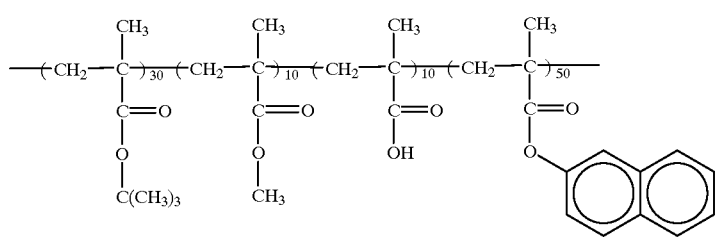
1-9
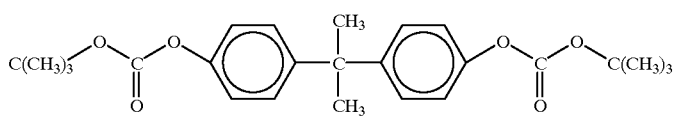
1-10
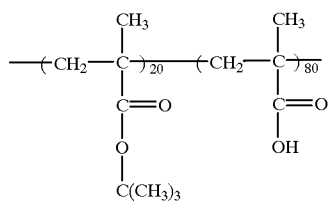
1-11
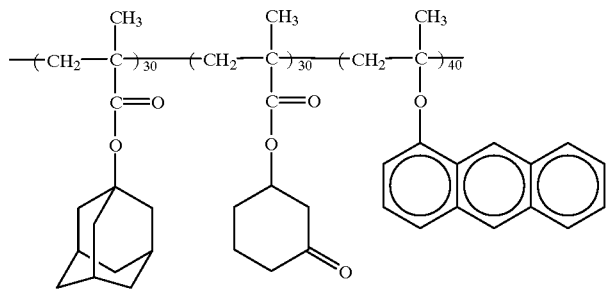
1-12
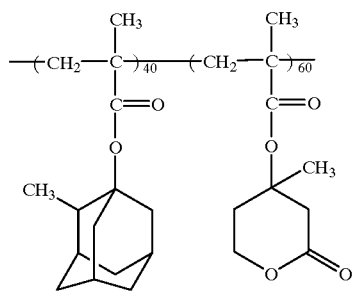

-continued
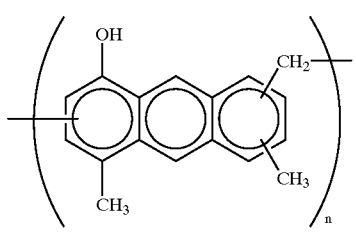
2-1
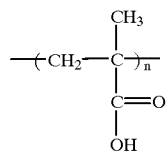
2-2
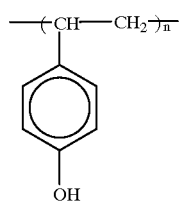
2-3
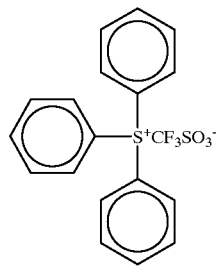
3-1
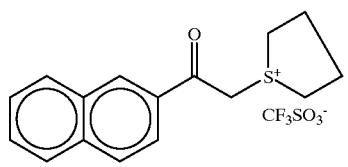
3-2
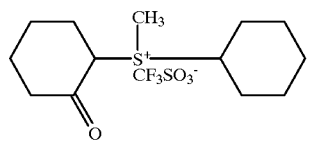
3-3
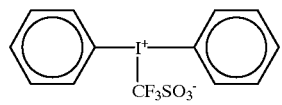
3-4

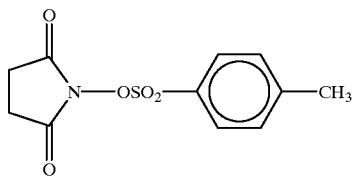

3-5

These compounds are respectively mixed with each other according to a predetermined formulations, thereby preparing underlying film compositions, which are then employed for forming a pattern respectively as explained below.

EXAMPLE 1

First of all, 10 g of a compound (1-1) having a weight average molecular weight of 11,000 as a solubility inhibiting agent and 1 g of a compound (3-1) as a photo-acid-generating agent were dissolved in 89 g of cyclohexanone to prepare a liquid material for an underlying film.

The liquid material thus prepared was then employed to form an underlying film functioning as an anti-reflective film. Then, the underlying film was patterned according to the process shown in FIGS. 2A to 2D thereby to form an anti-reflective film pattern.

First of all, a BPSG film (a work film 1) having a film thickness of 500 nm was formed on a silicon substrate by means of an LPCVD method. Then, the aforementioned liquid material for an underlying film was spin-coated on the surface of work film 1. Then, the coated layer was baked for 180 seconds at a temperature of 130° C. by making use of a hot plate to form an anti-reflective film (an underlying film) 2a having a thickness of 200 nm as shown in FIG. 2A. The complex index of refraction of the anti-reflective film 2a as measured at a wavelength of 248 nm was n=1.78 and k=0.49.

Then, a chemically amplified type positive resist (KRF M20G, JSR Co.) was coated on the surface of the anti-reflective film 2a, and the resultant resist layer was baked for 90 seconds at a temperature of 140° C. to form a resist film 3a as shown in FIG. 2B. The film thickness of the resist film 3a after the baking was 200 nm.

Subsequently, the resist film 3a and the anti-reflective film 2a were subjected to a patterning exposure as shown in FIG. 2C by making use of a reduced optical type stepper (NA= 0.6, σ=0.5) using KrF excimer laser 4 as a light source. The dosage of exposure (quantity of exposure) at this occasion was 28 mJ/cm².

Subsequently, the resist film 3a and the anti-reflective film 2a were baked on a hot plate for 90 seconds at a temperature of 140° C. thereby to form a latent image 5a of 0.15 μm line-and-space pattern in the resist film 3a and the anti-reflective film 2a as shown in FIG. 2C.

Thereafter, a paddle development using an aqueous solution of 0.21N tetramethyl ammonium hydroxide was performed for a period of 30 seconds so as to dissolve and remove the latent image 5a formed in the resist film 3a and the anti-reflective film 2a, thereby forming a pattern as shown in FIG. 2D.

When the section of the pattern thus obtained was observed using a scanning type electron microscope, the pattern of the anti-reflective film 2a thus developed was confirmed as having a perpendicular side wall as shown in FIG. 2D. Furthermore, the film thickness of the resist film 3a after the development of the anti-reflective film was 190 nm. Since the film thickness of the anti-reflective film was 200 nm, the film thickness of the masking material pattern consisting of the anti-reflective film pattern and the resist pattern was 390 nm. Therefore, this film thickness of the masking material pattern was found sufficient for using it as a mask for etching a work film (BPSG film) in the next step.

Since the reflection of light to the resist film was sufficiently suppressed by the effect of this anti-reflective film, the generation of a corrugated shape due to a standing wave was not recognized in the side wall of the resist pattern. Therefore, it was possible to form a pattern having a perpendicular side wall and being excellent in configuration, i.e. a rectangular cross-section.

COMPARATIVE EXAMPLE 1

First of all, 10 g of polysulfone was dissolved in 90 g of cyclohexanone to prepare a liquid material for an underlying film.

The liquid material thus prepared was then employed to form an underlying film functioning as an anti-reflective film. Then, the underlying film was patterned according to the process shown in FIGS. 5A to 5E thereby to form an anti-reflective film pattern.

Figure 5A:
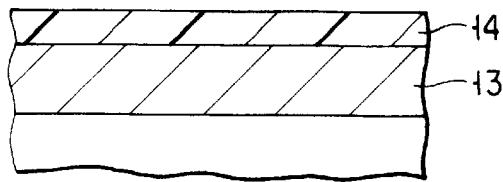
FIGS. 5A to 5E illustrate cross-sectional views sequentially showing the process of forming an anti-reflective film pattern according to the prior art.

First of all, a BPSG film (a work film 13) having a film thickness of 500 nm was formed on a silicon substrate by means of an LPCVD method. Then, the aforementioned liquid material for an underlying film was spin-coated on the surface of work film 13. Then, the coated layer was baked for 180 seconds at a temperature of 180° C. by making use of a hot plate to form an anti-reflective film (an underlying film) 14 having a thickness of 200 nm as shown in FIG. 5A. The complex index of refraction of the anti-reflective film 14 as measured at a wavelength of 248 nm was n=1.78 and k=0.24.

Figure 5B:
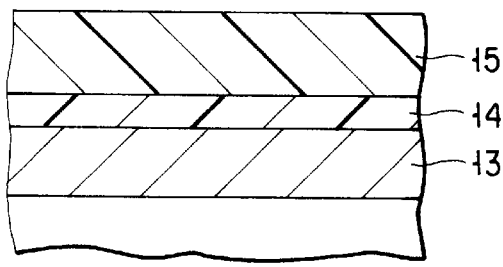

Then, a chemically amplified type positive resist (KRF M20G, JSR Co.) was coated on the surface of the anti-reflective film 14, and the resultant resist layer was baked for 90 seconds at a temperature of 140° C. to form a resist film 15 as shown in FIG. 5B. The film thickness of the resist film 15 after the baking was 200 nm.

Figure 5C:
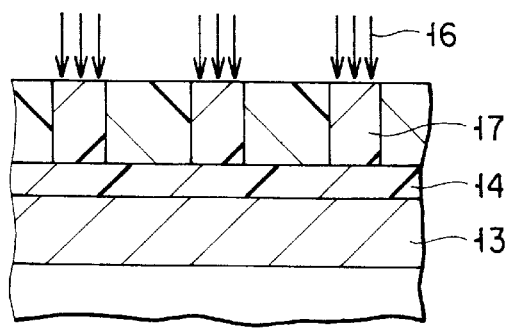

Subsequently, the resist film 15 was subjected to a patterning exposure as shown in FIG. 5C by making use of a reduced optical type stepper (NA=0.6, σ=0.5) using KrF excimer laser 16 as a light source. The dosage of exposure at this occasion was 28 mJ/cm².

Subsequently, the resist film 15 was baked on a hot plate for 90 seconds at a temperature of 140° C. thereby to form a latent image 17 of 0.15 μm line-and-space pattern in the resist film 15 as shown in FIG. 5C.

Figure 5D:
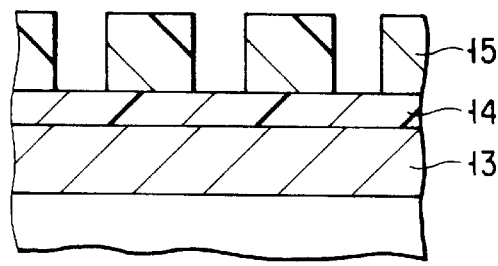

Thereafter, a paddle development using an aqueous solution of 0.21N tetramethyl ammonium hydroxide was performed for a period of 30 seconds so as to dissolve and remove the latent image 17 formed in the resist film 15, thereby forming a pattern as shown in FIG. 5D.

Then, the anti-reflective film 14 was etched by means of a dry etching method using this resist pattern as a mask. This etching was performed using a parallel-plate type reactive etching apparatus (RIE) under the conditions wherein an $O_2/CF_4$ gas: (flow rate: 50 sccm/200 sccm) was employed as a source gas, the exciting power was set to 800W, and the vacuum degree was set to 80 mTorr.

Figure 5E:
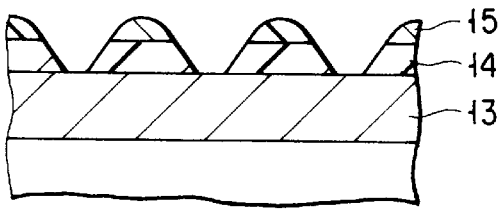

When the section of the pattern thus obtained was observed upon finishing the etching of the anti-reflective film 14 using a scanning type electron microscope, the resist pattern was found destroyed and almost dissipated during the etching process of the anti-reflective film 14 as shown in FIG. 5E, thus making it impossible to obtain a pattern of the anti-reflective film 14 having a perpendicular side wall.

As seen from this Comparative Example, In the patterning of anti-reflective film by making use of a dry etching method, if the film thickness of the resist film was thinned with a view to enhance the resolution, it could not avoid the erasing of the resist pattern together with the anti-reflective film. It was impossible to secure a sufficient film thickness of the masking material pattern consisting of the anti-reflective film pattern and the resist pattern, which is required for using it as a mask for etching a work film (BPSG film) in the next step.

Whereas in the case of the method according to this invention, even if the film thickness of the anti-reflective film was relatively large, the resist pattern could be transcribed to the anti-reflective film without causing a thinning of the resist pattern as shown in the above Example 1. Therefore, it was possible in the case of the method of this invention to secure a sufficient film thickness of the masking material pattern consisting of the anti-reflective film pattern and the resist pattern sufficient for using it as a mask for etching a work film (BPSG film) in the next step.

COMPARATIVE EXAMPLE 2

First of all, 10 g of polyamic acid (Chemitight CT4002T; Toshiba Chemicals Co., Ltd.) was dissolved in 90 g of NMP to prepare a liquid material for an underlying film.

The liquid material thus prepared was then employed to form an underlying film functioning as an anti-reflective film. Then, the underlying film was patterned according to the process shown in FIGS. 6A to 6D thereby to form an anti-reflective film pattern.

Figure 6A:
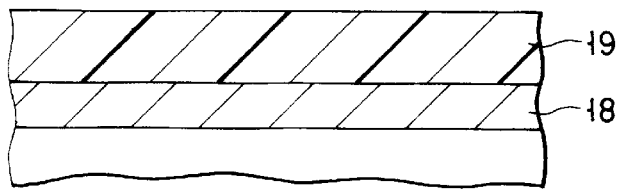
FIGS. 6A to 6D illustrate cross-sectional views sequentially showing the process of forming an anti-reflective film pattern according to the prior art.

First of all, a BPSG film (a work film 18) having a film thickness of 500 nm was formed on a silicon substrate by means of an LPCVD method. Then, the aforementioned liquid material for an underlying film was spin-coated on the surface of work film 18. Then, the coated layer was baked for 180 seconds at a temperature of 180° C. by making use of a hot plate to form an anti-reflective film (an underlying film) 19 having a thickness of 200 nm as shown in FIG. 6A. The complex index of refraction of the anti-reflective film 19 as measured at a wavelength of 248 nm was n=1.74 and k=0.32.

Figure 6B:
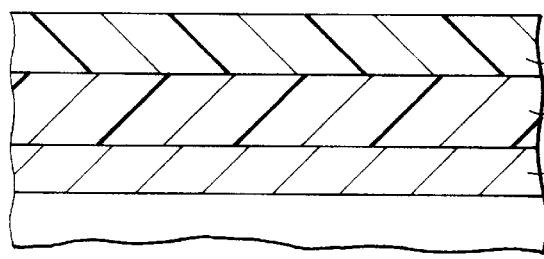

Then, a chemically amplified type positive resist (KRF M20G, JSR Co.) was coated on the surface of the anti-reflective film 19, and the resultant resist layer was baked for 90 seconds at a temperature of 140° C. to form a resist film 20 as shown in FIG. 6B. The film thickness of the resist film 20 after the baking was 200 nm.

Figure 6C:
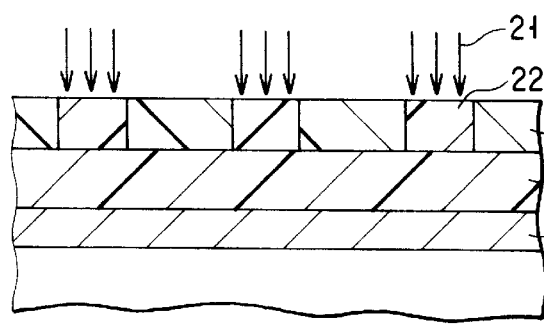

Subsequently, the resist film 20 was subjected to a patterning exposure as shown in FIG. 6C by making use of a reduced optical type stepper (NA=0.6, σ=0.5) using KrF excimer laser 21 as a light source. The dosage of exposure at this occasion was 27 mJ/cm².

Subsequently, the resist film 20 was baked on a hot plate for 90 seconds at a temperature of 140° C. thereby to form a latent image 22 of 0.15 μm line-and-space pattern in the resist film 20 as shown in FIG. 6C.

Thereafter, a paddle development using an aqueous solution of 0.21N tetramethyl ammonium hydroxide was performed for a period of 30 seconds so as to dissolve and remove the latent image 22 formed in the resist film 20 and also a portion of the anti-reflective film 19 disposed below the latent image 22, thereby forming a pattern.

Figure 6D:
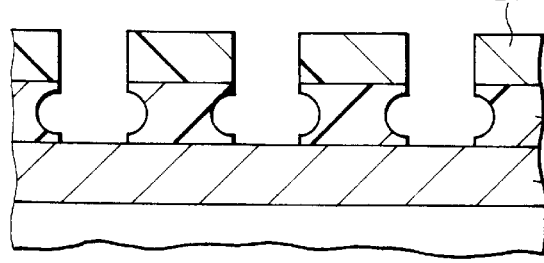

The underlying film composition employed in this Comparative Example was soluble in an alkaline developing solution. Therefore, it was possible at the occasion of developing the resist film to dissolve and remove the portion of the underlying film which was not covered by the resist pattern in simultaneous with the removal of the exposure portion of the resist film. However, since the developing was proceeded isotropically at the anti-reflective film 19, the shape of pattern obtained after the developing treatment became such as shown in FIG. 6D, i.e. a pattern having undercut (concaved) sides, thus failing to perform anisotropical development.

COMPARATIVE EXAMPLE 3

First of all, 1 g of anthracene (a dye) was added to 99 g of an i-line resist (IX-770, JSR Co.) to prepare a liquid material for an underlying film.

The liquid material thus prepared was then employed to form an underlying film functioning as an anti-reflective film. Then, the underlying film was patterned according to the process shown in FIGS. 7A to 7D thereby to form an anti-reflective film pattern.

Figure 7A:
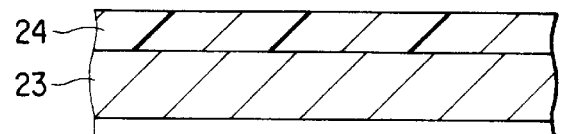
FIGS. 7A to 7D illustrate cross-sectional views sequentially showing the process of forming an anti-reflective film pattern according to the prior art.

First of all, a BPSG film (a work film 23) having a film thickness of 500 nm was formed on a silicon substrate by means of an LPCVD method. Then, the aforementioned liquid material for an underlying film was spin-coated on the surface of work film 23. Then, the coated layer was baked for 180 seconds at a temperature of 180° C. by making use of a hot plate to form an anti-reflective film (an underlying film) 24 having a thickness of 200 nm as shown in FIG. 7A. The complex index of refraction of the anti-reflective film 24 as measured at a wavelength of 248 nm was n=1.68 and k=0.20.

Figure 7B:
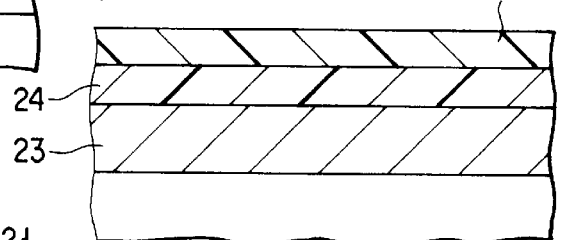

Then, a chemically amplified type positive resist (KRF M20G, JSR Co.) was coated on the surface of the anti-reflective film 24, and the resultant resist layer was baked for 90 seconds at a temperature of 140° C. to form a resist film 25 as shown in FIG. 7B. The film thickness of the resist film 25 after the baking was 200 nm.

Figure 7C:
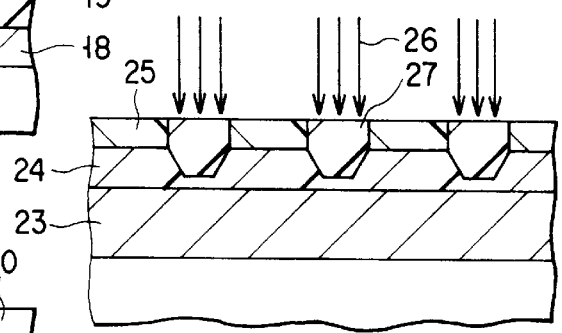

Subsequently, the resist film 25 and the anti-reflective film 24 were subjected to a patterning exposure as shown in FIG. 7C by making use of a reduced optical type stepper (NA=0.6, σ=0.5) using KrF excimer laser 26 as a light source. The dosage of exposure at this occasion was 30 mJ/cm².

Subsequently, the resist film 25 and the anti-reflective film 24 were baked on a hot plate for 90 seconds at a temperature of 140° C. thereby to form a latent image 27 of 0.15 μm line-and-space pattern in the resist film 25 and the anti-reflective film 24 as shown in FIG. 7C.

Thereafter, a paddle development using an aqueous solution of 0.21N tetramethyl ammonium hydroxide was performed for a period of 30 seconds so as to dissolve and remove the latent image 22 formed in the resist film 25 and in the anti-reflective film 24, thereby forming a pattern.

Figure 7D:
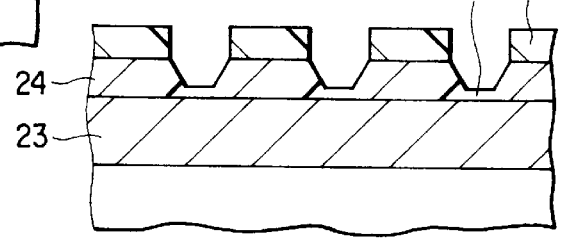

The underlying film composition employed in this Comparative Example for forming the anti-reflective film gave rise to a photosensitive reaction under a light exposure of 248 nm in wavelength, thus rendering the reacted portion of the underlying film to become soluble to an alkaline developing solution. However, since the anti-reflective film was superior in absorbency to a light having a wavelength of 248 nm, it was impossible allow the photosensitive reaction to proceed down to the bottom portion of the anti-reflective film. As a result, a residual layer 28 was caused to remain after the finishing of development of the anti-reflective film as shown in FIG. 7D.

COMPARATIVE EXAMPLE 4

This is a modified example of the aforementioned Comparative Example 1, i.e. a PCM method was employed and an anti-reflective film (an underlying film) was worked.

First of all, a resist pattern as shown in FIG. 5D was formed in the same manner as in Comparative Example 1. Then, an excimer lamp having a band width of 20 nm centering a wavelength of 172 nm was irradiated from the top of the resist pattern, thereby exposing the region of the anti-reflective film which was not covered by the resist pattern. The dosage of light in this case was 2.0 J/cm$^2$.

Since the resist film employed in this Comparative Example is low in permeability to an ultraviolet ray of 172 nm in wavelength, the light from the excimer lamp could penetrate into the surface of the resist pattern at a depth of only several nanometers. As a result, the exposure portion of the anti-reflective film (a region which was not covered by the resist pattern) could be selectively exposed.

Then, the exposure portion of the anti-reflective film was dissolved and removed through a developing treatment using anisole, thereby patterning the anti-reflective film. When the shapes of the resist pattern and anti-reflective film pattern were observed by means of a scanning type electron microscope, a residual of layer was recognized in the anti-reflective film pattern, thus failing to perpendicularly work the anti-reflective film. When the quantity of radiation was increased, the dissipation of the residual layer was recognized at 3.0 J/cm$^2$. However, the photo-reaction was generated even within the resist pattern thereby giving rise to a deformation of the pattern, and hence the resist pattern could not be used as a mask for the work film.

As in the case of this Comparative Example, a method wherein an underlying film consisting of a photo-decomposable resin is employed, and the underlying film is subsequently decomposed through an irradiation of light via a resist pattern and then removed through a developing treatment is accompanied with problems that a large quantity of light irradiation is required for the decomposition and that the resist pattern may be deformed. By contrast, in the method of this invention, since an underlying film is patterned through a catalytic reaction using an acid, it is possible to enhance the sensitivity of the underlying film and to perform the patterning of the underlying film without accompanying a deformation of the resist pattern.

EXAMPLE 2

9 g of a compound (1-2) having a weight average molecular weight of 12,000 as a solubility inhibiting agent and 1 g of a compound (1-3) as a solubility inhibiting agent were dissolved in 89 g of cyclohexanone to prepare a liquid material for an underlying film.

The liquid material thus prepared was then employed to form an underlying film functioning as an anti-reflective film. Then, the underlying film was patterned according to the process shown in FIGS. 2A to 2D thereby to form an anti-reflective film pattern.

First of all, an SiO$_2$ film (a work film 1) having a film thickness of 500 nm was formed on a silicon substrate by means of a sputtering method. Then, the aforementioned liquid material for an underlying film was spin-coated on the surface of work film 1. Then, the coated layer was baked for 180 seconds at a temperature of 150° C. by making use of a hot plate to form an anti-reflective film (an underlying film) 2a having a thickness of 200 nm as shown in FIG. 2A. The complex index of refraction of the anti-reflective film 2a as measured at a wavelength of 248 nm was n=1.65 and k=0.62.

On the other hand, 9.9 g of polyvinylphenol protected with tertiary butoxycarbonyl group substituting for 30% of hydroxyl group of the polyvinylphenol (weight average molecular weight of 13,000) and 0.1 g of sulfoneimide as a photo-acid-generating agent were dissolved in 90 g of ethyl lactate to prepare a liquid material of a chemically amplified type positive resist. Then, this liquid material was coated on the surface of the anti-reflective film 2a, and the resultant resist layer was baked for 90 seconds at a temperature of 110° C. to form a resist film 3a. The film thickness of the resist film 3a after the baking was 200 nm.

Subsequently, the resist film 3a and the anti-reflective film 2a were subjected to a patterning exposure as shown in FIG. 2C by making use of a reduced optical type stepper (NA= 0.6, σ=0.5) using KrF excimer laser 4 as a light source. The dosage of exposure at this occasion was 24 mJ/cm$^2$.

Subsequently, the resist film 3a and the anti-reflective film 2a were baked on a hot plate for 90 seconds at a temperature of 110° C. thereby to form a latent image 5a of 0.18 μm line-and-space pattern in the resist film 3a and the anti-reflective film 2a as shown in FIG. 2C.

Thereafter, a paddle development using an aqueous solution of 0.21N tetramethyl ammonium hydroxide was performed for a period of 30 seconds so as to dissolve and remove the latent image 5a formed in the resist film 3a and the anti-reflective film 2a, thereby forming a pattern as shown in FIG. 2D.

When the section of the pattern thus obtained was observed using a scanning type electron microscope, the pattern of the anti-reflective film 2a thus developed was confirmed as having a perpendicular side wall as shown in FIG. 2D.

As shown in this example, if a photo-acid-generating agent is included in the resist film, the photo-acid-generating agent may not be included in the anti-reflective film. Namely, since an acid can be generated, through an irradiation of light, from the photo-acid-generating agent included in the resist film, and the acid generated functions to decompose the solubility inhibiting agent included in the anti-reflective film, it is possible to form a pattern having a perpendicular side wall and being excellent in configuration, i.e. a rectangular cross-section.

EXAMPLE 3

At first, four kinds of liquid material of underlying film were prepared as shown in the following (a) to (d).

(a) 9.9 g of a compound (1-2) having a weight average molecular weight of 8,000 as a solubility inhibiting agent and 0.1 g of a compound (3-2) as a photo-acid-generating agent were dissolved in 90.0 g of cyclohexanone.

(b) 9 g of a compound (1-4) having a weight average molecular weight of 12,000 as a solubility inhibiting agent and 1 g of a compound (3-3) as a photo-acid-generating agent were dissolved in 90.0 g of cyclohexanone.

(c) 9.8 g of a compound (1-5) having a weight average molecular weight of 11,000 as a solubility inhibiting agent and 0.2 g of a compound (3-2) as a photo-acid-generating agent were dissolved in 90 g of anisole.

(d) 4 g of a compound (1-1) having a weight average molecular weight of 12,000 as a solubility inhibiting agent, 0.2 g of a compound (3-2) as a photo-acid-generating agent and 5.8 g of a compound (2-1) having a weight average molecular weight of 8,000 as an alkali-soluble resin were dissolved in 90.0 g of cyclohexanone.

The liquid materials thus prepared were then employed respectively to form an underlying film functioning as an anti-reflective film. Then, each underlying film was patterned as follows thereby to form an anti-reflective film pattern.

First of all, a TEOS oxide film (a work film) having a film thickness of 500 nm was formed on a silicon substrate by means of an LPCVD method. Then, the aforementioned liquid materials for an underlying film were respectively spin-coated on the surface of work film. Then, each coated layer was baked for 90 seconds at a baking temperature shown in the following Table 1 by making use of a hot plate to form an anti-reflective film (an underlying film) having a thickness of 200 nm. The complex index of refraction of each anti-reflective film as measured at a wavelength of 248 nm is summarized in the Table 1.

Then, a chemically amplified type positive resist (KRF M20G, JSR Co.) was coated on the surface of each anti-reflective film, and the resultant resist layer was baked for 90 seconds at a temperature of 140° C. to form a resist film. The film thickness of the resist film after the baking was 200 nm.

Subsequently, the resist film and the anti-reflective film were subjected to a patterning exposure by making use of a reduced optical type stepper (NA=0.6, σ=0.5) using KrF excimer laser as a light source. The dosage of exposure at this occasion was 24 mJ/cm$^2$.

Subsequently, the resist film and the anti-reflective film were baked on a hot plate for 90 seconds at a temperature of 140° C. thereby to form a latent image of 0.15 μm line-and-space pattern in the resist film and the anti-reflective film.

Thereafter, a paddle development using an aqueous solution of 0.21N tetramethyl ammonium hydroxide was performed for a period of 30 seconds so as to dissolve and remove the latent image formed in the resist film and the anti-reflective film, thereby forming a 0.15 μm line-and-space pattern in the resist film and the anti-reflective film.

When the section of each pattern thus obtained was observed using a scanning type electron microscope, it was confirmed that in any of combinations between the anti-reflective film and the resist, the generation of a corrugated shape due to a standing wave was not recognized in the side wall of the resist pattern, and the standing wave was suppressed in any of the anti-reflective films. Furthermore, the configuration of the anti-reflective film after the developing treatment was found excellent, i.e. rectangular in cross-section.

The film thickness of each of the resist patterns after the developing treatment of the anti-reflective films is summarized in the following Table 1.

TABLE 1

| Kinds of liquid material of anti-reflective film | Baking temp. (° C.) | At a wavelength of 248 nm | | Thickness of resist film after development of anti-reflective film |
|---|---|---|---|---|
| | | n | k | |
| a) | 120 | 1.78 | 0.20 | 192 |
| b) | 130 | 1.64 | 0.48 | 195 |
| c) | 130 | 1.59 | 0.02 | 190 |
| d) | 120 | 1.63 | 0.53 | 192 |

As shown in Table 1, the magnitude of thinning (reduction) of the resist pattern was found extremely small, i.e. as small as 10 nm or less. Since the film thickness of the anti-reflective film was 200 nm, the film thickness of the masking material pattern consisting of the anti-reflective film pattern and the resist pattern was 390 nm or more. Therefore, this film thickness of the masking material pattern was found sufficient for using it as a mask for etching a work film (TEOS oxide film) in the next step.

EXAMPLE 4

At first, four kinds of liquid material of underlying film were prepared as shown in the following (a) to (d).

(a) 10 g of melamine-formaldehyde resin, 0.5 g of a compound (3-1) as a photo-acid-generating agent, and 2 g of a compound (p-14) as an alkali-soluble resin were dissolved in 87.5 g of anisole.

(b) 10 g of urea-formaldehyde resin, 0.5 g of a compound (3-2) as a photo-acid-generating agent, and 2 g of a compound (p-12) as an alkali-soluble resin were dissolved in 87.5 g of anisole.

(c) 10 g of glycol-formaldehyde resin, 0.5 g of a compound (3-3) as a photo-acid-generating agent, and 2 g of a compound (p-11) as an alkali-soluble resin were dissolved in 87.5 g of anisole.

(d) 10 g of melamine resin, 2 g of urea resin, and 0.5 g of sulfoneimide as a photo-acid-generating agent were dissolved in 87.5 g of anisole.

The liquid materials thus prepared were then employed respectively to form an underlying film functioning as an anti-reflective film. Then, each underlying film was patterned according to the process shown in FIGS. 3A to 3D thereby to form an anti-reflective film pattern.

First of all, by making use of spin-on glass (R-7, Hitachi Kasei Co., Ltd.), a spin-on glass film (a work film 1) having a film thickness of 500 nm was formed on a silicon substrate. Then, each liquid material for an underlying film was coated on the surface of work film 1. Then, the coated layer was baked for 60 seconds at a baking temperature shown in the following Table 2 by making use of a hot plate to form an anti-reflective film (an underlying film) 2b having a thickness of 200 nm as shown in FIG. 3A. The complex index of refraction of each anti-reflective film 2b as measured at a wavelength of 248 nm was summarized in the following Table 2.

Then, a chemically amplified type negative resist (SNR200, Shipley Co.) was coated on the surface of each anti-reflective film 2b, and the resultant resist layer was baked for 90 seconds at a temperature of 140° C. to form a resist film 3b as shown in FIG. 3B. The film thickness of the resist film 3b after the baking was 200 nm.

Subsequently, the resist film 3b and the anti-reflective film 2b were subjected to a patterning exposure as shown in FIG.

3C by making use of a reduced optical type stepper (NA= 0.6, σ=0.7) using KrF excimer laser as a light source. The dosage of exposure at this occasion was 98 mJ/cm².

Then, the resist film 3b and the anti-reflective film 2b were baked on a hot plate for 90 seconds at a temperature of 125° C. thereby to form a latent image 5b of 0.25 μm line-and-space pattern in the resist film 3b and the anti-reflective film 2b as shown in FIG. 3C, the portions of the resist film 3b and anti-reflective film 2b which correspond to the latent image 5b being allowed to crosslink.

Thereafter, a paddle development using an aqueous solution of 0.14N tetramethyl ammonium hydroxide was performed for a period of 30 seconds so as to dissolve and remove portions other than the latent image 5b formed in the resist film 3b and the anti-reflective film 2b, thereby forming a 0.25 μm line-and-space pattern in the resist film 3b and the anti-reflective film 2b as shown in FIG. 3D.

When the section of each pattern thus obtained was observed using a scanning type electron microscope, it was confirmed that in any of combinations between the anti-reflective film and the resist, the generation of a corrugated shape due to a standing wave was not recognized in the side wall of the resist pattern, and the standing wave was suppressed in any of the anti-reflective films. Furthermore, the configuration of the anti-reflective film after the developing treatment was found excellent, i.e. rectangular in cross-section.

The film thickness of each of the resist patterns after the developing treatment of the anti-reflective films is summarized in the following Table 2.

TABLE 2

| Kinds of liquid material of anti-reflective film | Baking temp. (° C.) | At a wavelength of 248 nm | | Thickness of resist film after development of anti-reflective film |
| --- | --- | --- | --- | --- |
| | | n | k | |
| a) | 130 | 1.72 | 0.42 | 190 |
| b) | 130 | 1.68 | 0.55 | 192 |
| c) | 130 | 1.74 | 0.48 | 193 |
| d) | 150 | 1.75 | 0.39 | 190 |

As shown in Table 2, the magnitude of thinning (reduction) of the resist pattern was found extremely small, i.e. as small as 10 nm or less. Since the film thickness of the anti-reflective film was 200 nm, the film thickness of the masking material pattern consisting of the anti-reflective film pattern and the resist pattern was 390 nm or more. Therefore, this film thickness of the masking material pattern was found sufficient for using it as a mask for etching a work film (spin-on glass film) in the next step.

As described above, it is possible to employ a negative resist in the method of forming a pattern according to the first Method of this invention. In this case, the exposure portions of the resist film 3b and anti-reflective film 2b were allowed to crosslink, thus being left as a pattern.

EXAMPLE 5

At first, four kinds of liquid material of underlying film were prepared as shown in the following (a) to (d).

(a) 9.8 g of a compound (1-1) having a weight average molecular weight of 15,000 as a solubility inhibiting agent and 0.2 g of a compound (3-3) as a photo-acid-generating agent were dissolved in 90.0 g of cyclohexanone.

(b) 9.8 g of a compound (1-5) having a weight average molecular weight of 17,000 as a solubility inhibiting agent, 2 g of a compound (1-7) as a solubility inhibiting agent, and 0.2 g of a compound (3-3) as a photo-acid-generating agent were dissolved in 88 g of cyclohexanone.

(c) 4.8 g of a compound (1-5) having a weight average molecular weight of 16,000 as a solubility inhibiting agent, 4 g of a compound (2-2) as an alkali-soluble resin, and 0.2 g of a compound (3-1) as a photo-acid-generating agent were dissolved in 91 g of anisole.

(d) 9.8 g of a compound (1-6) having a weight average molecular weight of 15,000 as a solubility inhibiting agent, 2 g of a compound (2-3) as an alkali-soluble resin, and 0.2 g of a compound (3-1) as a photo-acid-generating agent were dissolved in 87 g of xylene.

The liquid materials thus prepared were then employed respectively to form an underlying film functioning as an anti-reflective film. Then, each underlying film was patterned as follows thereby to form an anti-reflective film pattern.

Then, an SiN film (a work film) having a film thickness of 500 nm was formed on a silicon substrate by means of an LPCVD method. Then, the aforementioned liquid materials for an underlying film were respectively coated on the surface of work film. Then, each coated layer was baked for 90 seconds at a baking temperature shown in the following Table 3 by making use of a hot plate to form an anti-reflective film (an underlying film) having a thickness of 200 nm. The complex index of refraction of each anti-reflective film as measured at a wavelength of 193 nm is summarized in the Table 3.

On the other hand, 9.8 g of a compound (1-8) as a solubility inhibiting agent, 2 g of a compound (1-9) as a solubility inhibiting agent, and 0.2 g of a compound (3-4) as a photo-acid-generating agent were dissolved in 87 g of ethyl lactate to prepare a liquid material of resist. Then, this liquid material was coated on the surface of each anti-reflective film, and the resultant resist layer was baked for 90 seconds at a temperature of 110° C. to form a resist film. The film thickness of the resist film after the baking was 200 nm.

Subsequently, the resist film and the anti-reflective film were subjected to a patterning exposure by making use of an ArF exposure apparatus (NA=0.55, σ=0.7). The dosage of exposure at this occasion was 32 mJ/cm².

Subsequently, the resist film and the anti-reflective film were baked on a hot plate for 90 seconds at a temperature of 110° C. thereby to form a latent image of 0.20 μm line-and-space pattern in the resist film and the anti-reflective film.

Thereafter, a paddle development using an aqueous solution of 0.21N tetramethyl ammonium hydroxide was performed for a period of 30 seconds so as to dissolve and remove the latent image formed in the resist film and the anti-reflective film, thereby forming a 0.20 μm line-and-space pattern in the resist film and the anti-reflective film.

When the section of each pattern thus obtained was observed using a scanning type electron microscope, it was confirmed that in any of combinations between the anti-reflective film and the resist, the generation of a corrugated shape due to a standing wave was not recognized in the side wall of the resist pattern, and the standing wave was suppressed in any of the anti-reflective films. Furthermore, the configuration of the anti-reflective film after the developing treatment was found excellent, i.e. rectangular in cross-section.

The film thickness of each of the resist patterns after the developing treatment of the anti-reflective films and anti-reflective film is summarized in the following Table 3.

TABLE 3

| Kinds of liquid material of anti-reflective film | Baking temp. (° C.) | At a wavelength of 193 nm | | Thickness of resist film after development of anti-reflective film |
|---|---|---|---|---|
| | | n | k | |
| a) | 120 | 1.59 | 0.69 | 192 |
| b) | 140 | 1.62 | 0.58 | 192 |
| c) | 140 | 1.57 | 0.49 | 191 |
| d) | 140 | 1.68 | 0.57 | 192 |

As shown in Table 3, the magnitude of thinning (reduction) of the resist pattern was found extremely small, i.e. as small as 10 nm or less. Since the film thickness of the anti-reflective film was 200 nm, the film thickness of the masking material pattern consisting of the anti-reflective film pattern and the resist pattern was 390 nm or more. Therefore, this film thickness of the masking material pattern was found sufficient for using it as a mask for etching a work film (SiN film) in the next step.

EXAMPLE 6

At first, seven kinds of liquid material of underlying film were prepared as shown in the following (a) to (g).

(a) 9.8 g of a compound (1-1) having a weight average molecular weight of 14,000 as a solubility inhibiting agent and 0.2 g of a compound (3-1) as a photo-acid-generating agent were dissolved in 90.0 g of cyclohexanone.

(b) 8 g of a compound (1-2) having a weight average molecular weight of 17,000 as a solubility inhibiting agent, 1.8 g of a compound (1-7) having a weight average molecular weight of 13,000 as a solubility inhibiting agent, and 0.2 g of a compound (3-1) as a photo-acid-generating agent were dissolved in 90 g of cyclohexanone.

(c) 3.8 g of a compound (1-11) having a weight average molecular weight of 15,000 as a solubility inhibiting agent, 6 g of a compound (1-3) as a solubility inhibiting agent, and 0.2 g of a compound (3-1) as a photo-acid-generating agent were dissolved in 90 g of cyclohexanone.

(d) 9.8 g of a compound (1-12) having a weight average molecular weight of 15,000 as a solubility inhibiting agent, 1 g of anthraquinone as a dye, and 0.2 g of a compound (3-4) as a photo-acid-generating agent were dissolved in 89 g of cyclohexanone.

(e) 9.8 g of a compound (1-4) having a weight average molecular weight of 13,000 as a solubility inhibiting agent and 0.2 g of a compound (3-3) as a photo-acid-generating agent were dissolved in 90 g of ethyl lactate.

(f) 4.8 g of a compound (1-12) having a weight average molecular weight of 14,000 as a solubility inhibiting agent, 5 g of a compound (1-3) having a weight average molecular weight of 18,000 as a solubility inhibiting agent, and 0.2 g of a compound (3-2) as a photo-acid-generating agent were dissolved in 90 g of cyclohexanone.

(g) 8 g of a compound (1-1) having a weight average molecular weight of 13,000 as a solubility inhibiting agent, 3.8 g of a compound (2-1) having a weight average molecular weight of 15,000 as an alkali-soluble resin, and 0.2 g of a compound (3-4) as a photo-acid-generating agent were dissolved in 88 g of cyclohexanone.

The liquid materials thus prepared were then employed respectively to form an underlying film functioning as an anti-reflective film. Then, each underlying film was patterned according to the process shown in FIGS. 4A to 4F thereby to form an anti-reflective film pattern.

First of all, a TEOS oxide film (a work film) having a film thickness of 700 nm was formed on a silicon substrate by means of an LPCVD method. Then, the aforementioned liquid materials for an underlying film were respectively spin-coated on the surface of work film. Then, each coated layer was baked for 90 seconds at a prebaking temperature shown in the following Table 4 by making use of a hot plate to form an anti-reflective film (an underlying film) 7 having a thickness of 400 nm as shown in FIG. 4A. The complex index of refraction of each anti-reflective film as measured at a wavelength of 248 nm is summarized in the Table 4.

Then, each resist solution prepared in the aforementioned Example 2 was coated on the surface of each anti-reflective film, and the resultant resist layer was baked on a hot plate for 90 seconds at a temperature of 140° C. to form a resist film 8 having a thickness of 200 nm as shown in FIG. 4B.

Subsequently, the resist film 8 was subjected to a patterning exposure by making use of a KrF exposure apparatus (NA=0.60, σ=0.65) as shown in FIG. 4C. The dosage of exposure at this occasion was 24 mJ/cm$^2$.

Thereafter, the resist film was baked on a hot plate for 90 seconds at a temperature of 110° C. thereby to form a latent image 10 of a contact hole pattern having a diameter of 0.20 μm at the exposure portion of the resist film 8 as shown in FIG. 4C.

Thereafter, a paddle development using an aqueous solution of 0.21N tetramethyl ammonium hydroxide was performed for a period of 30 seconds so as to dissolve and remove the latent image 10 formed in the resist film 8, thereby forming a contact hole pattern having a diameter of 0.20 μm as shown in FIG. 4D.

Then, as shown in FIG. 4E, an excimer lamp having a band width of 20 nm centering a wavelength of 172 nm was irradiated all over the wafer. Thereafter, the resist film was baked on a hot plate. In this case, the quantity of exposure of the excimer lamp was set as shown in Table 4, and the baking was performed for 90 seconds at a postbaking temperature shown in Table 4. As a result, a latent image of contact hole pattern having a diameter of 0.20 μm was formed in the anti-reflective film 7.

Although the light thus irradiated could penetrate into the surface of the resist pattern at a depth of only several nanometers, the light could reach to the bottom portion of the anti-reflective film 7. As a result, only the exposure portion of the anti-reflective film (a region which was not covered by the resist pattern) could be selectively exposed, thus making it possible to form a latent image therein. Moreover, the surface portion of the resist pattern was allowed to crosslink, thereby forming a crosslinked surface layer 12.

Finally, a paddle development using a developing solution of a normality indicated in Table 4 was performed for a period of 30 seconds so as to dissolve and remove the latent image formed in the anti-reflective film 7, thereby forming a contact hole pattern having a diameter of 0.20 μm in the anti-reflective film 7 as shown in FIG. 4F.

When the section of each pattern thus obtained was observed using a scanning type electron microscope, it was confirmed that in any of combinations between the anti-reflective film and the resist, the generation of a corrugated shape due to a standing wave was not recognized in the side wall of the resist pattern, and the standing wave was suppressed in any of the anti-reflective films. Furthermore, the configuration of the anti-reflective film after the developing treatment was found excellent, i.e. rectangular in cross-section.

The film thickness of each of the resist patterns after the developing treatment of the anti-reflective films is summarized in the following Table 4.

TABLE 4

| Kinds of liquid material of anti-reflective film | Prebaking temp. [° C.] | Post-baking temp. [° C.] | At a wavelength of 248 nm | | Dosage [mJ/cm$^2$] | Normality of development solution | Thickness of resist film after development of anti-reflective film |
|---|---|---|---|---|---|---|---|
| | | | n | K | | | |
| a) | 110 | 120 | 1.78 | 0.24 | 50 | 0.21 | 192 |
| b) | 120 | 125 | 1.64 | 0.17 | 40 | 0.26 | 191 |
| c) | 120 | 125 | 1.78 | 0.55 | 35 | 0.21 | 190 |
| d) | 110 | 120 | 1.59 | 0.59 | 62 | 0.13 | 193 |
| e) | 100 | 110 | 1.62 | 0.28 | 72 | 0.26 | 195 |
| f) | 130 | 135 | 1.58 | 0.30 | 48 | 0.13 | 192 |
| g) | 120 | 125 | 1.59 | 0.52 | 39 | 0.26 | 191 |

As shown in Table 4, the magnitude of thinning (reduction) of the resist pattern was found extremely small, i.e. as small as 10 nm or less. Since the film thickness of the anti-reflective film was 400 nm, the film thickness of the masking material pattern consisting of the anti-reflective film pattern and the resist pattern was 490 nm or more. Therefore, this film thickness of the masking material pattern was found sufficient for using it as a mask for etching a work film (TEOS oxide film) in the next step.

It will be seen from this example that even an anti-reflective film having as high thickness as 400 nm is employed, the anti-reflective film can be worked into a configuration having a perpendicular side wall.

EXAMPLE 7

This example explains one example where the method of forming a pattern by making use of the second Method of this invention was applied to the working of an insulating film which is required for forming a buried wiring by means of a dual damascene process.

In this example, a liquid material prepared in Example 1 was employed as a liquid material of underlying film for forming an anti-reflective film (underlying film), and the patterning of the anti-reflective film was performed by a process shown in FIGS. 8A to 8I.

First of all, an aluminum film having a thickness of 300 nm was formed on the silicon wafer by means of sputtering method, and then a TEOS oxide film having a thickness of 800 nm was formed on the aluminum film by means of an LPCVD.

Then, a liquid material of the underlying film which was prepared in Example 1 was coated on the surface of the TEOS oxide film. Then, the coated layer was baked for 60 seconds at a temperature of 130° C. to form an anti-reflective film (an underlying film) having a thickness of 55 nm.

Then, a chemically amplified type positive resist (KRF M20G, JSR Co.) was coated on the surface of the anti-reflective film, and the resultant resist layer was baked for 90 seconds at a temperature of 140° C. to form a resist film. The film thickness of the resist film after the baking was 200 nm.

Subsequently, the resist film thus formed was subjected to a patterning exposure by making use of a reduced optical type stepper (NA=0.6, σ=0.5) using KrF excimer laser as a light source. The dosage of exposure at this occasion was 28 mJ/cm$^2$.

Subsequently, the resist film was baked on a hot plate for 90 seconds at a temperature of 110° C. thereby to form a latent image of 0.20 μm line-and-space pattern in the resist film and the anti-reflective film.

Thereafter, a paddle development using an aqueous solution of 0.21N tetramethyl ammonium hydroxide was performed for a period of 30 seconds so as to dissolve and remove the latent image formed in the resist film and the anti-reflective film, thereby forming a 0.20 μm line-and-space pattern in the resist film and the anti-reflective film.

Then, the TEOS oxide film was etched to a depth of 200 nm using the resist pattern and the anti-reflective film pattern as a mask. In this etching, a magnetron type RIE apparatus was employed under the conditions: $C_4F_8$ gas (flow rate: 10 sccm), Ar gas (flow rate: 100 sccm) and CO gas (flow rate: 50 sccm) were employed as a source gas, the exciting power was set to 800W, the degree of vacuum was set to 80 mTorr, and the temperature of the substrate was set to 40° C.

Finally, the resist pattern and the anti-reflective film pattern were removed by means of ashing. In this ashing, a down flow type ashing apparatus was employed under the conditions: $O_2$ gas (flow rate: 500 sccm) was employed, the exciting power was set to 800W, the degree of vacuum was set to 80 mTorr, and the temperature of the substrate was set to 200° C.

Figure 8A:
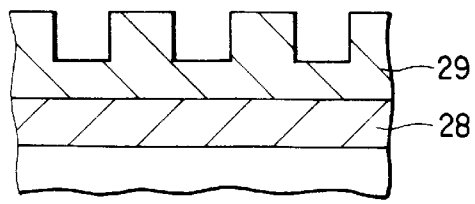
FIGS. 8A to 8I illustrate cross-sectional views sequentially showing the process of forming a pattern according to another example of this invention.

As a result, a groove of 0.20 μm line-and-space pattern was formed in the TEOS oxide film 29 formed on the aluminum film 28 as shown in FIG. 8A.

Figure 8B:
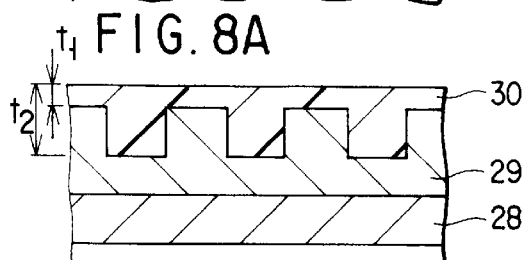

Then, a liquid material of underlying film prepared in Example 1 was spin-coated on the TEOS oxide film 29 provided with the aforementioned groove, and then baked on a hot plate for 120 seconds at a temperature of 130° C. As a result, the TEOS oxide film 29 provided with a 0.20 μm line-and-space pattern having a depth of 200 nm could be buried underneath an anti-reflective film (underlying film) 30 as shown in FIG. 8B.

Since the anti-reflective film which was formed using a material prepared in Example 1 had a glass transition temperature of 105° C., the anti-reflective film could be allowed to flow and completely fill the groove of the TEOS oxide film 29 by the aforementioned baking process at a temperature of 130° C. The thickness ($t_1$) of the anti-reflective film 30 at the projected portion of the TEOS oxide film 29 was 20 nm, while the thickness ($t_2$) of the anti-reflective film 30 at the recessed portion of the TEOS oxide film 29 was 220 nm.

Figure 8C:
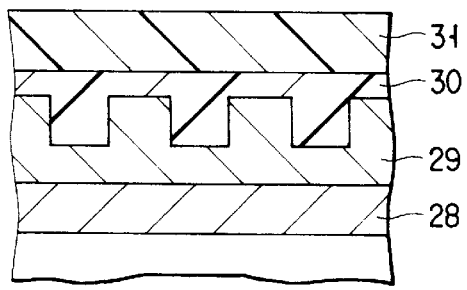

Then, a chemically amplified type positive resist (KRF M20G, JSR Co.) was coated on the surface of the anti-reflective film 30 thus formed, and the resultant resist layer was baked for 90 seconds at a temperature of 140° C. to form a resist film 31 as shown in FIG. 8C. The thickness of the resist film 31 after the baking was 200 nm.

Figure 8D:
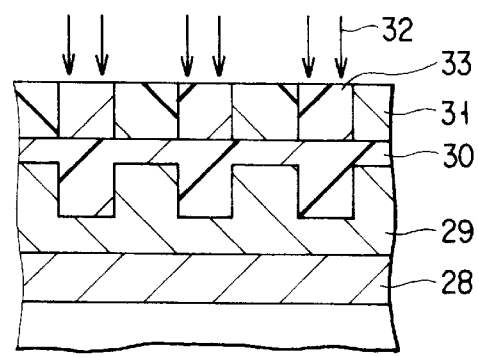

Subsequently, the resist film 31 thus formed was subjected to a patterning exposure by making use of a reduced optical type stepper (NA=0.6, σ=0.5) using KrF excimer laser 32 as a light source as shown in FIG. 8D. The dosage of exposure at this occasion was 29 mJ/cm$^2$.

Subsequently, the resist film was baked on a hot plate for 90 seconds at a temperature of 110° C. thereby to form a latent image 33 of contact hole pattern having a diameter of 0.15 μm in the resist film 31 as shown in FIG. 8D. The location of this latent image 33 was found to correspond with the central portion of the groove formed in the TEOS oxide film.

Figure 8E:
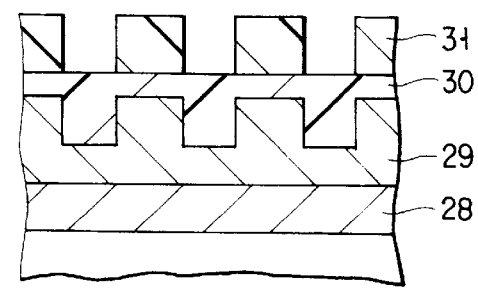

Thereafter, a paddle development using an aqueous solution of 0.21N tetramethyl ammonium hydroxide was performed for a period of 30 seconds so as to dissolve and remove the latent image portion formed in the resist film 31, thereby forming a contact hole pattern having a diameter of 0.15 μm in the resist film as shown in FIG. 8E.

Figure 8F:
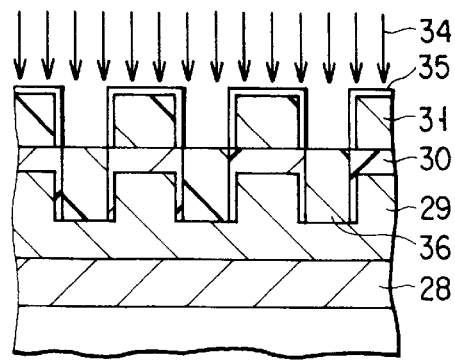

Thereafter, as shown in FIG. 8F, an ArF excimer laser 34 was irradiated all over the wafer thereby to form a latent image 36 of contact hole having a diameter of 0.15 μm in the anti-reflective film 30. The quantity of exposure in this case was 80 J/cm$^2$. As a result, the surface portion of the resist pattern was allowed to crosslink, thereby forming a crosslinked surface layer 35 as shown in FIG. 8F.

Figure 8G:
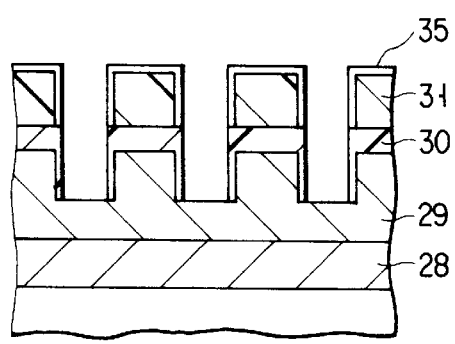

Thereafter, a paddle development using an aqueous solution of 0.21N tetramethyl ammonium hydroxide was performed for a period of 30 seconds so as to dissolve and remove the latent image 36 formed in the anti-reflective film 30, thereby forming a contact hole pattern having a diameter of 0.15 μm in the anti-reflective film 30 as shown in FIG. 8G.

Figure 8H:
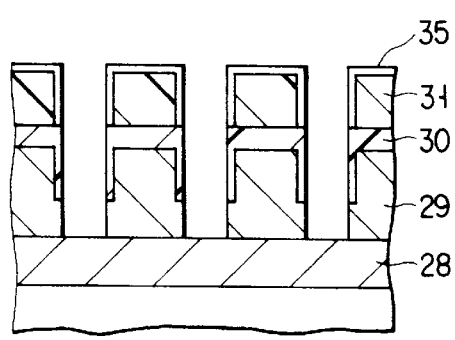

Then, the TEOS oxide film 29 was dry-etched using the resist pattern and the anti-reflective film pattern thus obtained as a mask, thereby forming a contact hole pattern having a diameter of 0.15 μm in the TEOS oxide film 29 as shown in FIG. 8H. In this etching, a magnetron type RIE apparatus was employed under the conditions: $C_4F_8$ gas (flow rate: 10 sccm), Ar gas (flow rate: 100 sccm) and CO gas (flow rate: 50 sccm) were employed as a source gas, the exciting power was set to 800W, the degree of vacuum was set to 80 mTorr, and the temperature of the substrate was set to 40° C.

Figure 8I:
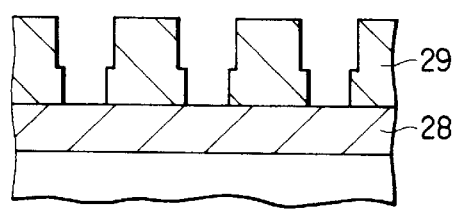

Finally, the resist pattern and the anti-reflective film pattern were removed by means of ashing, thus forming a structure shown in FIG. 8I. In this ashing, a down flow type ashing apparatus was employed under the conditions: $O_2$ gas (flow rate: 500 sccm) was employed, the exciting power was set to 800W, the degree of vacuum was set to 80 mTorr, and the temperature of the substrate was set to 200° C.

As explained above, it is possible according to this invention to work an anti-reflective film into a configuration having a perpendicular side wall without accompanying a thinning of a resist film. Therefore, this invention is particularly applicable to a process such as the working of insulating film in a dual damascene process where the thickness of anti-reflective film to be worked is relatively large.

In the foregoing explanation, this invention has been explained taking an anti-reflective film to be employed in a photolithography as an example of the underlying film. However, this invention is not limited to the anti-reflective film. For example, the underlying film composition of this invention is also applicable to an antistatic material which can be employed in an electric charge beam lithography for preventing a misregistration due to the accumulation of electric charge.

Following Examples 8 to 10 illustrate the examples where the composition of this invention was employed as an antistatic material.

EXAMPLE 8

In this example, the liquid materials of underlying film (a) to (d) which were prepared in the aforementioned Example 3, and the liquid material of underlying film (u-1) were employed for forming a pattern.

First of all, 9.8 g of a compound (1-10) as a solubility inhibiting agent and 0.2 g of a compound (3-4) as a photo-acid-generating agent were dissolved in cyclohexanone to prepare a liquid material of underlying film (u-1).

This liquid material of underlying film (u-1) and the liquid materials of underlying film (a) to (d) which were prepared in the aforementioned Example 3 were employed in the same manner as in Example 3, thereby successively depositing a work film and an underlying film on a silicon substrate.

Specifically, a TEOS oxide film (work film) having a thickness of 500 nm was formed on a silicon substrate by means of an LPCVD method. Then, each of the aforementioned liquid materials of the underlying film were coated on the surface of the TEOS oxide film (work film). Then, the coated layer was baked on a hot plate. In this baking, the liquid materials of underlying film (a) to (d) were baked at a temperature indicated in Table 1 for 90 seconds, while the liquid material of underlying film (u-1) was baked at a temperature of 130° C. for 90 seconds. As a result, antistatic films (underlying film) having a thickness of 200 nm were obtained.

Then, a chemically amplified type positive resist (KRF M20G, JSR Co.) was coated on the surface of each antistatic film, and the resultant resist layer was baked for 90 seconds at a temperature of 140° C. to form a resist film. The film thickness of the resist film after the baking was 200 nm.

Subsequently, the resist film and the antistatic film were subjected to a patterning exposure (1.7 μC/cm$^2$) by making use of an electron beam 50 kV in accelerating voltage. Thereafter, the resist film and the antistatic film were baked using a hot plate for 90 seconds at a temperature of 140° C., thereby forming a latent image of 0.13 μm line-and-space pattern in the resist film and the antistatic film.

Thereafter, a paddle development using an aqueous solution of 0.21N tetramethyl ammonium hydroxide was performed for a period of 30 seconds so as to dissolve and remove the latent image formed in the resist film and the antistatic film, thereby forming a 0.13 μm line-and-space pattern in the resist film and the antistatic film.

When the pattern thus obtained was observed from the top using a scanning type electron microscope, any misregistration due to an accumulation of electric charge was not recognized. This can be attributed to the fact that since a photo-acid-generating agent was contained in the antistatic film, a conductive material was generated from the photo-acid-generating agent due to an irradiation of the electron beam, thereby allowing the electric charge to escape outward through this conductive material.

When the section of the pattern thus obtained was observed using a scanning type electron microscope, the pattern of the antistatic film thus developed was confirmed excellent, having a perpendicular side wall. Further, the magnitude of thinning (reduction) of the resist pattern after the development of the antistatic film was found extremely small, i.e. as small as 10 nm or less in any sample of the antistatic film. Since the film thickness of the antistatic film was 200 nm, the film thickness of the masking material pattern consisting of the antistatic film pattern and the resist pattern was 390 nm or more. Therefore, this film thickness of the masking material pattern was found sufficient for using it as a mask for etching a work film (TEOS oxide film) in the next step.

When an underlying film is employed as an antistatic material, a polycyclic aromatic hydrocarbon group may not necessarily be included in the underlying film composition as in the case of the aforementioned liquid material of underlying film (u-1).

EXAMPLE 9

In this example, the liquid materials of underlying film (a) to (g) which were prepared in the aforementioned Example 6, and the liquid material of underlying film (u-1) which was prepared in the aforementioned Example 8 were employed for forming a pattern.

In the same manner as in the case of Example 6, a work film and an antistatic film (work film) were successively deposited on a silicon substrate. As for the material (u-1), an underlying film was formed in the same manner as illustrated in Example 8. Then, the resist solution prepared in Example 2 was coated on each antistatic film thereby to form a resist film having a thickness of 200 nm in the same manner as in the case of Example 2.

Subsequently, the resist film was subjected to a patterning exposure (2.9 $\mu C/cm^2$) by making use of an electron beam 50 kV in accelerating voltage. Thereafter, the resist film was baked using a hot plate for 90 seconds at a temperature of 110° C., thereby forming a latent image of 0.13 $\mu m$ line-and-space pattern in the resist film.

Thereafter, a paddle development using an aqueous solution of 0.21N tetramethyl ammonium hydroxide was performed for a period of 30 seconds so as to dissolve and remove the latent image formed in the resist film, thereby forming a 0.13 $\mu m$ line-and-space pattern in the resist film.

Thereafter, the antistatic film was irradiated with excimer lamp in the same manner as in Example 6, and then baked. As for the materials (a) to (g), the quantity of exposure and the temperature of post baking thereof were adopted as indicated in Table 4, while as for the material (u-1), the quantity of exposure was set to 42 mJ/cm², and the post baking was performed at a temperature of 130° C. for 90 seconds. As a result, an latent image of 0.13 $\mu m$ contact hole pattern was formed in the exposure portion (a region which was not covered by the resist pattern) of the antistatic film.

Finally, in the case of the materials (a) to (g), a paddle development was performed using a developing solution having a normality shown in Table 4 for 30 seconds, thereby dissolving and removing the latent image formed in the antistatic film, thus forming a contact hole pattern having a diameter of 0.13 $\mu m$ in the antistatic film. In the case of the antistatic film which was formed using the liquid material of underlying film (u-1), a paddle development was performed using a 0.21N developing solution for 30 seconds, thereby dissolving and removing the latent image formed in the antistatic film, thus also forming a contact hole pattern having a diameter of 0.13 $\mu m$ in the antistatic film.

When the pattern thus obtained was observed from the top using a scanning type electron microscope, any misregistration due to an accumulation of electric charge was not recognized. This can be attributed to the fact that since a photo-acid-generating agent was contained in the antistatic film, a conductive material was generated from the photo-acid-generating agent due to an irradiation of the electron beam, thereby allowing the electric charge to escape outward through this conductive material.

When the section of the pattern thus obtained was observed using a scanning type electron microscope, the pattern of the antistatic film thus developed was confirmed excellent, having a perpendicular side wall. Further, the magnitude of thinning (reduction) of the resist pattern after the development of the antistatic film was found extremely small, i.e. as small as 10 nm or less in any sample of the antistatic film. Since the film thickness of the antistatic film was 200 nm, the film thickness of the masking material pattern consisting of the antistatic film pattern and the resist pattern was 390 nm or more. Therefore, this film thickness of the masking material pattern was found sufficient for using it as a mask for etching a work film (TEOS oxide film) in the next step.

When an underlying film is employed as an antistatic material, a polycyclic aromatic hydrocarbon group may not necessarily be included in the underlying film composition as in the case of the aforementioned liquid material of underlying film (u-1).

EXAMPLE 10

In this example, the liquid materials of underlying film (a) to (g) which were prepared in the aforementioned Example 6 were employed for forming a pattern.

In the same manner as in the case of Example 6, a work film and an antistatic film (work film) were successively deposited on a silicon substrate. Then, the resist solution prepared in Example 2 was coated on each antistatic film thereby to form a resist film having a thickness of 200 nm in the same manner as in the case of Example 6.

Subsequently, the resist film was subjected to a patterning exposure (5.9 $\mu C/cm^2$) by making use of an electron beam 50 kV in accelerating voltage, thereby foring a latent image of contact hole pattern having a diameter of 0.13 $\mu m$.

Thereafter, the resist film was subjected to a patterning exposure by making use of a reduced optical type stepper (NA=0.6, σ=0.7) using KrF excimer laser as a light source thereby to form a latent image of 0.15 $\mu m$ line-and-space pattern. The dosage of exposure at this occasion was 25 mJ/cm². Then, the resist film was baked using a hot plate for 90 seconds at a temperature of 140° C.

Thereafter, a paddle development using an aqueous solution of 0.21N tetramethyl ammonium hydroxide was performed for a period of 30 seconds so as to dissolve and remove the latent image formed in the resist film, thereby forming a resist pattern consisting of a contact hole pattern and a line-and-space pattern.

Thereafter, the antistatic film was irradiated with excimer lamp in the same manner as in Example 6, and then baked. As a result, an latent image was formed in the exposure portion (a region which was not covered by the resist pattern) of the antistatic film. Further, the surface of the resist pattern was allowed to crosslink thereby to form a crosslinked surface layer.

Finally, in the same manner as explained in Example 6, the latent image formed in the antistatic film was dissolved and removed through a developing treatment, thus transcribing the resist pattern onto the antistatic film.

When the contact hole pattern thus obtained through electron beam was observed from the top using a scanning type electron microscope, any misregistration due to an accumulation of electric charge was not recognized in any combination between the resist film and the antistatic film. This can be attributed to the fact that since a photo-acid-generating agent was contained in the antistatic film, a conductive material was generated from the photo-acid-generating agent due to an irradiation of the electron beam, thereby allowing the electric charge to escape outward through this conductive material.

When the section of the pattern thus obtained was observed using a scanning type electron microscope, the line-and-space pattern formed using the light exposure was free from rugged shape to be induced by a standing wave, thus indicating an effective inhibition of light reflection from the underlying film. Further, the configuration of pattern of antistatic film was found excellent, having a perpendicular side wall.

Furthermore, the magnitude of thinning (reduction) of the resist pattern after the development of the antistatic film was found extremely small, i.e. as small as 10 nm or less in any sample of the antistatic film. Since the film thickness of the antistatic film was 200 nm, the film thickness of the masking material pattern consisting of the antistatic film pattern and the resist pattern was 390 nm or more. Therefore, this film thickness of the masking material pattern was found sufficient for using it as a mask for etching a work film (TEOS oxide film) in the next step.

As clearly seen from this example, the underlying film composition according to this invention is quite suited for use as an underlying film for a hybrid exposure using both light and electron beam. If the underlying film is to be employed in this case, a polycyclic aromatic hydrocarbon group should preferably be included in the underlying film composition in order to enable the underlying film to function as an anti-reflective film.

As explained above, it is possible according to this invention to provide a composition for an underlying film which is capable of forming a pattern having a perpendicular side wall and being excellent in cross-sectional configuration, i.e. a rectangular cross-section.

It is also possible according to this invention to provide a method of forming an underlying film pattern having a perpendicular side wall and being excellent in cross-sectional configuration, i.e. a rectangular cross-section, said method being capable of inhibiting the film-thinning of a resist pattern superimposed on the underlying film and enabling to obtain an underlying film pattern with high resolution and high dimension precision.

In particular, when a polycyclic aromatic hydrocarbon group is included in the underlying film composition of this invention, it is possible to work even an underlying film having a relatively large thickness which is comparable to the resist film to obtain a configuration having a perpendicular side wall without accompanying a thinning of resist film.

This invention is very useful for performing a fine working in the manufacture of a semiconductor device, and hence is very valuable in industrial view point.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern which comprises the steps of:

forming an underlying film on a work film;

forming a resist film on said underlying film;

exposing said underlying film and said resist film to a patterning exposure light; and developing said resist film and said underlying film with a developing solution to dissolve and remove a predetermined region of said underlying film with a portion of said resist film thereon, thereby forming a pattern comprising an underlying film pattern and a resist pattern positioned thereon; and wherein:
  said resist film and/or said underlying film contains an acid-generating agent which generates an acid when an exposure is carried out; and
  said underlying film includes a compound whose solubility in said developing solution is changed by an action of said acid.

2. The method according to claim 1 wherein said underlying film is constituted by a composition comprising a compound having a substituent group which is adapted to be decomposed by an acid and capable of generating an alkali-soluble group after the decomposition thereof; and a photo-acid-generating agent which is capable of generating said acid; wherein an exposure portion of said underlying film is adapted to be dissolved and removed by said developing solution.

3. The method according to claim 1 wherein said underlying film is constituted by a composition comprising a compound having a substituent group which is adapted to be cross-linked by an acid; and a photo-acid-generating agent which is capable of generating said acid; wherein a non-exposure portion of said underlying film is adapted to be dissolved and removed by said developing solution.

4. A method of forming a pattern as claimed in claim 1, wherein said exposure is carried out, said acid generated from said acid-generating agent reacts with said compound included in said underlying film, whereby the solubility of an exposed portion of said underlying film is changed.

5. A method of forming a pattern which comprises the steps of;

forming an underlying film on a work film;

forming a resist film containing a phenolic resin on said underlying film;

exposing said resist film to a patterning exposure light using a first irradiation of light;

developing said resist film thus exposed with a developing solution to form a resist pattern;

exposing said underlying film through said resist pattern used as a mask to a patterning exposure light using a second irradiation of light; and developing an exposed region of said underlying film;

wherein said underlying film is constituted by an underlying film composition containing a compound having a substituent group which is adapted to be decomposed by an acid and capable of generating an alkali-soluble group after the decomposition thereof, and a photo-acid-generating agent which is capable of generating said acid; said underlying film composition further comprising a polycyclic aromatic hydrocarbon group.

6. The method according to claim 5 wherein said first irradiation of light has a wavelength ranging from 240 to 450 nm, and said second irradiation of light has a wavelength ranging from 150 to 230 nm.

7. The method according to claim 5 wherein said polycyclic aromatic hydrocarbon group is bonded to said compound having a substituent group which is adapted to be decomposed by an acid and capable of generating an alkali-soluble group after the decomposition thereof.

8. The method according to claim 5 which further comprises a step of subjecting said resist film to a patterning exposure by means of an electric charge beam.

9. A method of forming a pattern which comprises the steps of;

forming an underlying film on a work film, said underlying film containing a compound having a substituent group which is adapted to be decomposed by an acid and capable of generating an alkali-soluble group after the decomposition thereof, and a photo-acid-generating agent which is capable of generating said acid;

forming a resist film containing a phenolic resin on said underlying film;

exposing said resist film to an electric charge beam;

developing said resist film thus exposed to form a resist pattern;

exposing said underlying film through said resist pattern used as a mask to an irradiation of light; and developing an exposed region of said underlying film.

10. The method according to claim 9 wherein the light to be irradiated onto said underlying film has a wavelength ranging from 150 to 230 nm.

* * * * *